US006965284B2

(12) United States Patent
Maekawa et al.

(10) Patent No.: US 6,965,284 B2

(45) Date of Patent: Nov. 15, 2005

(54) DIELECTRIC FILTER, ANTENNA DUPLEXER

(75) Inventors: Tomoya Maekawa, Osaka (JP); Yasuhiro Sugaya, Osaka (JP); Toru Yamada, Osaka (JP); Toshio Ishizaki, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 78 days.

(21) Appl. No.: 10/220,037

(22) PCT Filed: Feb. 26, 2002

(86) PCT No.: PCT/JP02/01737

§ 371 (c)(1), (2), (4) Date: Feb. 10, 2003

(87) PCT Pub. No.: WO02/071532

PCT Pub. Date: Sep. 12, 2002

(65) Prior Publication Data

US 2003/0141948 A1 Jul. 31, 2003

(30) Foreign Application Priority Data

Mar. 2, 2001 (JP) ............................ 2001-057751
Mar. 15, 2001 (JP) ............................ 2001-073727

(51) Int. Cl.[7] .......................... H01P 1/203; H03H 7/01

(52) U.S. Cl. ...................... 333/204; 333/185; 333/219

(58) Field of Search .............................. 333/202–205, 333/185, 219

(56) References Cited

U.S. PATENT DOCUMENTS 5,497,130 A 3/1996 Hirai et al.
6,020,799 A 2/2000 Ishizaki et al.
6,147,571 A * 11/2000 Kitazawa et al. ........... 333/126
6,437,665 B1 * 8/2002 Kato ......................... 333/185
6,529,096 B2 * 3/2003 Maekawa et al. ........... 333/134
6,765,459 B2 * 7/2004 Hirai et al. ................ 333/204

FOREIGN PATENT DOCUMENTS

| | | |
|---|---|---|
| EP | 1 003 216 | 5/2000 |
| JP | 05-152803 | 6/1993 |
| JP | 5-299913 | 11/1993 |
| JP | 405299913 A | * 11/1993 |
| JP | 9-307320 | 11/1997 |
| JP | 10-209707 | 8/1998 |
| JP | 2000-156621 | 6/2000 |
| KR | 1999-0036334 | 5/1999 |
| KR | 2000-0034924 | 6/2000 |
| WO | 97/48146 | 12/1997 |

* cited by examiner

*Primary Examiner*—Dinh T. Le
(74) *Attorney, Agent, or Firm*—Wenderoth, Lind & Ponack, L.L.P.

(57) ABSTRACT

A dielectric filter includes resonator electrodes, an inter-stage coupling capacitor electrode, and an input/output coupling capacitor electrode on dielectric substrates, respectively. The resonator electrodes are electro-magnetically coupled to each other to form a tri-plate structure, are made of a metallic foil embedded in a resonator dielectric substrate. Another dielectric filter includes an upper shield electrode dielectric substrate, an inter-stage coupling capacitor dielectric substrate, a resonator dielectric substrate, and an input/output coupling capacitor dielectric substrate which are made of a composite dielectric material including a high-dielectric-constant material and a low-dielectric-constant material. The above described arrangement provides the dielectric filter with an improved Q factor of a resonator, a low loss, and a high attenuation.

44 Claims, 14 Drawing Sheets

DIELECTRIC FILTER, ANTENNA DUPLEXER

TECHNICAL FIELD

The present invention relates to a dielectric filter for a high-frequency radio apparatus such as a mobile telephone, and particularly to a dielectric filter including strip-line resonator electrodes electro-magnetically coupled with each other provided on a dielectric substrate.

BACKGROUND ART

Dielectric filters have recently been used as high-frequency filters in mobile telephones, they particularly are required to have a reduced overall size and thickness. A flat, multi-layer dielectric filter instead of a coaxial filter is now focused. A conventional flat, multi-layer dielectric filter will be explained referring to relevant drawings.

FIG. 17 is an exploded perspective view of the conventional flat, multi-layer dielectric filter. The dielectric filter having a shown layer structure includes six dielectric substrates 1*a* to 1*f*. A shield electrode 2*a* is formed on the upper surface of the dielectric substrate 1*b*. An inter-stage coupling capacitor electrode 3 is formed on the upper surface of the dielectric substrate 1*c*. Resonator electrodes 4*a* and 4*b* are formed on the upper surface of the dielectric substrate 1*d*. Input/output coupling capacitor electrodes 5*a* and 5*b* are formed on the surface of the dielectric substrate 1*e*. A shield electrode 2*b* is formed on the upper surface of the dielectric substrate 1*f*.

End electrodes 6*a* and 6*b* as grounding ports are formed on both, left and right, sides, respectively. An end electrode 7 is formed on the back side as a grounding port connected to respective open ends of the shield electrodes 2*a* and 2*b* and the resonator electrodes 4*a* and 4*b*. An end electrode 8 provided on the front side of the dielectric substrate layer structure is connected, at one end, to respective short-circuit ends of the resonator electrodes 4*a* and 4*b*, and connected, at the other end, to the shield electrodes 2*a* and 2*b*. End electrodes 9*a* and 9*b* at the left and right sides of the multi-layer dielectric substrate are connected to the input/output coupling electrodes 5*a* and 5*b*, respectively, thus operating as input/output ports.

The resonator electrodes, the inter-stage coupling capacitor electrode, and the input/output coupling capacitor electrodes of the flat, multi-layer dielectric filter are manufactured with printed patterns of conductive paste and thus are hardly have uniform thicknesses.

FIG. 18 is a cross sectional view of the dielectric substrates 1*c* and 1*d* shown in FIG. 1. As shown, the resonator electrodes 4*a* and 4*b* are thick at the center and tapered towards the edges. When the dielectric substrates are laminated, the electrodes provided by printing may be sharpened at their edge. A high-frequency current is concentrated at the edges. This reduces a Q-factor of the resonator electrode, and thus the filter has a declining performance. The conductive paste containing mainly metal powder, upon being screen-printed, may has an undulated surface due to a screen-printing mesh thus declining the performance of the filter.

The resonator electrodes, the inter-stage coupling capacitor electrode, and the input/output coupling capacitor electrodes of the flat, multi-layer type dielectric filter are provided on respective surfaces of the ceramic substrates of identical material having an identical dielectric constant. Therefore, since a current in a resonator, an essential element of the dielectric filter, concentrates at each edge of the resonator electrodes 4*a* and 4*b*, the current increase causes a conductor loss thus declining the Q factor of the resonator and the performance of the dielectric filter.

SUMMARY OF THE INVENTION

A dielectric filter includes resonator electrodes made of metallic foil, electro-magnetically coupled with each other, an inter-stage coupling capacitor electrode for coupling the resonator electrodes, an input/output coupling capacitor electrode for inputting and outputting a signal to the resonator electrodes, and dielectric substrates having the resonator electrodes, the inter-stage coupling capacitor electrode, and the input/output coupling capacitor electrode provided thereon. In the filter, each resonator electrode has a uniform thickness, thus providing a high Q factor of a resonator, a low loss, and a high attenuation.

DESCRIPTION OF THE PREFERRED EMBODIMENTS

Embodiment 1

Figure 1:
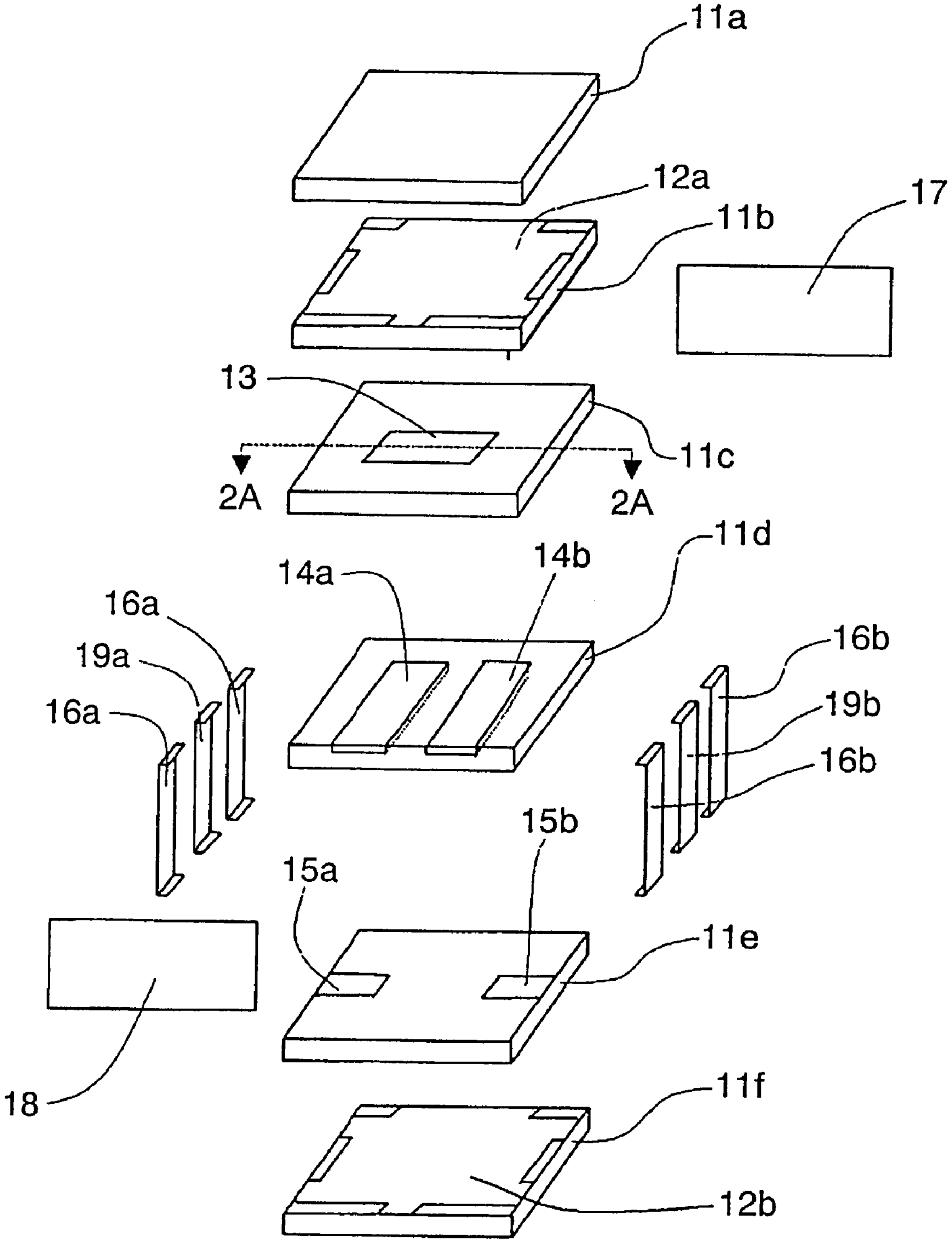
FIG. 1 is an exploded perspective view of a dielectric filter according to Embodiment 1 of the present invention.

FIG. 1 is an exploded perspective view of a dielectric filter according to Embodiment 1 of the present invention. The dielectric filter, having a basic arrangement identical to that shown in FIG. 17, includes six dielectric substrates 11*a* to 11*f*. The resonator dielectric substrate 11*d* including resonator electrodes is a ceramic substrate having a high dielectric constant, but may be a resin substrate or a resin composite substrate containing resin material and inorganic filler.

A shield electrode dielectric substrate 11*b* includes a shield electrode 12*a* on the upper surface thereof. An inter-stage coupling capacitor dielectric substrate 11*c* has an inter-stage coupling capacitor electrode 13 on the upper surface thereof. The resonator dielectric substrate 11*d* includes resonator electrodes 14*a* and 14*b* made of foil containing gold, silver, or copper having a thickness ranging 10 μm to 400 μm on the upper surface thereof. Each resonator electrode has a cross section having a four-sided shape with rounded corners. An input/output coupling capacitor dielectric substrate 11*e* includes input/output coupling capacitor electrodes 15*a* and 15*b* on the upper surface thereof. A shield electrode dielectric substrate 11*f* includes a shield electrode 12*b* on the upper surface thereof. The dielectric substrates 11*a* to 11*f* are laminated together in a layer arrangement thus composing a dielectric filter.

Similarly to the conventional filter, end electrodes 16*a* and 16*b* are provided in the left and right sides thereof. End electrodes 19*a* and 19*b* are provided as input/output ports on both the left and right sides and connected to the input/output coupling capacitor electrodes 15*a* and 15*b*, respectively. End electrodes 17 and 18 are provided on the front and rear sides of the laminated dielectric substrates.

The filter according to the present embodiment features an arrangement of the resonator electrodes. The resonator electrodes 14*a* and 14*b* are made of metallic foil containing gold, silver, or copper on the upper surface of the resonator dielectric substrate 11*d* as shown in FIG. 1.

Figure 2A:
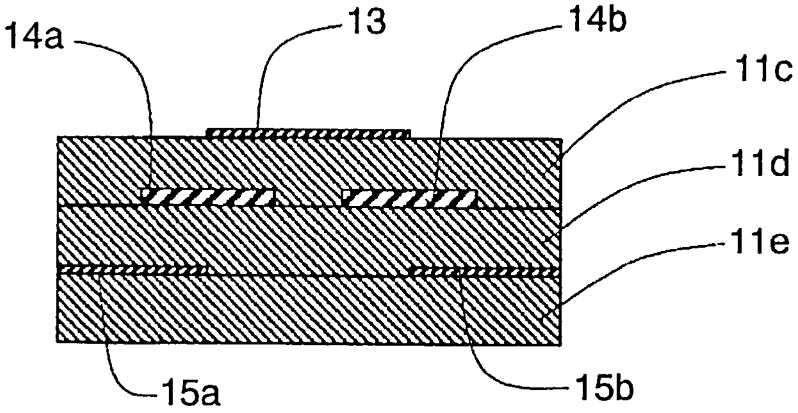
FIG. 2A is a cross sectional view of the dielectric substrate layer structure at a line 2A—2A of FIG. 1.

FIG. 2A is a cross sectional view of the dielectric substrates 11*c*, 11*d*, and 11*e* at a line 2A—2A of FIG. 1. The resonator electrodes 14*a* and 14*b* of the metallic foil containing gold, silver, or copper are located on the upper surface of the resonator dielectric substrate 11*d*, of which manufacturing method will be explained later in more detail. Also, the inter-stage coupling capacitor electrode 13 and the input/output coupling capacitor electrodes 15*a* and 15*b* are provided with printed patterns of conductive paste on the upper surfaces of the inter-stage coupling capacitor dielectric substrate 11*c* and the input/output coupling capacitor dielectric substrate 11*e*, respectively. The inter-stage coupling capacitor electrode 13 and the input/output coupling capacitor electrodes 15*a* and 15*b* may be made of the same metallic foil as the resonator electrodes 14*a* and 14*b*.

Figure 2B:
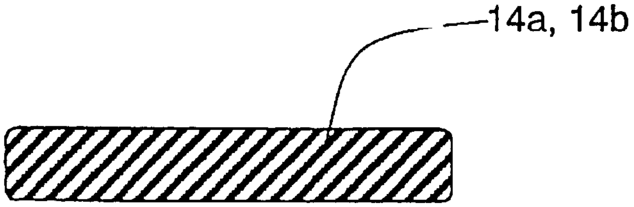
FIG. 2B is an enlarged cross sectional view of a resonator electrode.

Each of the resonator electrodes 14*a* and 14*b* of this embodiment may have a cross section with rounded corners and a rounded edge for improved electrical performance as shown in FIG. 2B. The rounded corners and edge may have a radius of 1 μm or greater. The resonator electrodes 14*a* and 14*b* have the cross section of a rectanglar with the rounded corners which may be formed with a strip of an electric electrode frame into a desired electrode size by being etched chemically or polished electrolytically. More preferably, the resonator electrodes 14*a* and 14*b* may be subjected to surface-polishing or metal-plating to have smooth surfaces having a roughness ranging from 0.5 μm to 0.01 μm.

The resonator electrodes 14*a* and 14*b*, upon being made of the metallic foil having smooth surface, form the resonator having an improved Q factor, hence contributing to the lower loss and the better attenuation property of the dielectric filter.

Figure 2C:
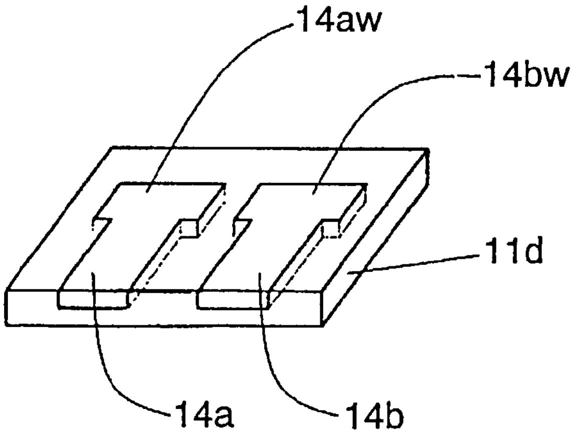
FIG. 2C is a perspective view of a resonator dielectric substrate including a resonator electrode provided thereon having a wide portion.

The resonator electrodes 14*a* and 14*b* are not limited to the shape of a uniform width strip as shown in FIG. 1, but may be arranged with a T-shape having a wide portion 14*aw* or 14*ab* as shown in FIG. 2C according to a required characteristic.

According to the present embodiment, the filter includes the strip electrode of the metallic foil having a thickness ranging from 10 μm to 400 μm. In the dielectric filter operating at a high frequency, a high-frequency current does not flow uniformly in the thickness of the electrodes, but may be intensified at a region close to the surface of the electrodes. The conductor of the resonator has a thickness greater than the thickness of the region, a surface thickness. The strip electrode, where a high-frequency current flows along the upper and lower surfaces, has a thickness of twice of that of the conductor. It is hence preferable that when the surface depth ranges substantially from 1 μm to 3 μm at a frequency of GHz, the metallic foil has a thickness of 10 μm or greater, greater than twice the depth. The resonator has the Q factor elevating until having a thickness of 100 μm, and has the factor remaining unchanged or increased very little from a thickness of 200 μm according to experiments. The dielectric filter gets thick as the strip gets thick. According to the above, the metallic foil may preferably have a thickness of 400 μm or smaller The metallic foil of the resonator electrodes containing copper and silver of 100 μm thickness provides the Q factor of 280. The resonator electrodes formed by a known printing method of 40 μm thickness provides the Q factor of 240. Therefore, the resonator electrodes of the metallic foil in this embodiment provides the resonator with the improved Q factor.

Embodiment 2

FIGS. 3A to 3F illustrate a method of manufacturing a resonator dielectric substrate 27, an essential element of a dielectric filter according to Embodiment 2 of the present invention.

Figure 3A:
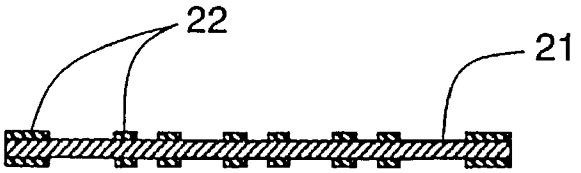
FIGS. 3A to 3F illustrate a procedure of manufacturing a dielectric filter according to Embodiment 2 of the invention.
Figure 3B:
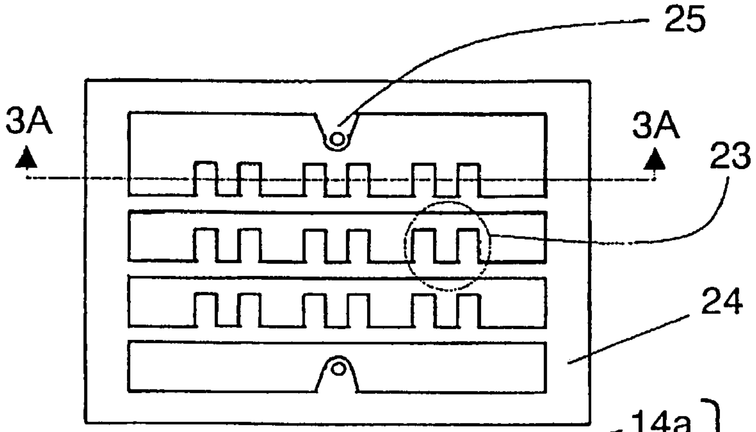

FIG. 3A is a cross sectional view of the substrate at a line 3A—3A of the plan view of FIG. 3B. Identical patterns of an etching-resist layer 22 are provided by photolithography on both, upper and lower surfaces of a metallic foil 21 containing gold, silver, or copper. The metallic foil 21, when being etched from both sides and then polished at the surface by chemical or electrolytic process, is finished as an electrode frame 24 having resonator electrodes 23 as shown in FIG. 3B. The electrode frame 24 includes positioning guides 25 on inner sides thereof. The electrode frame 24 may be manufactured by die molding.

Figure 3C:
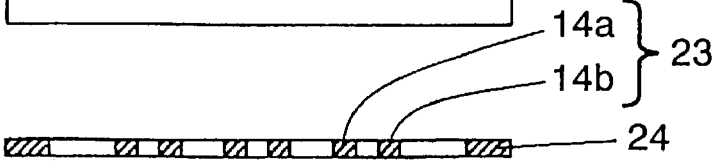
Figure 3D:
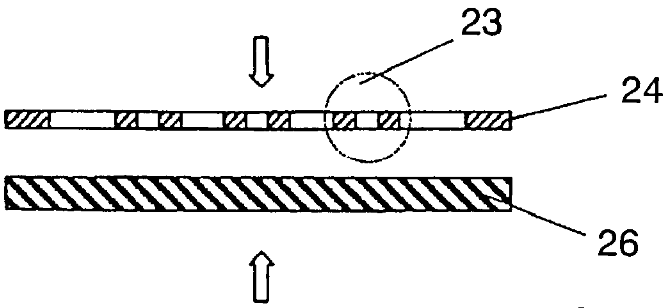
Figure 3E:
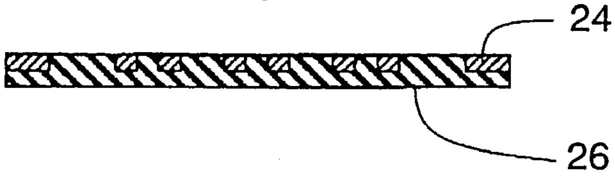
Figure 3F:
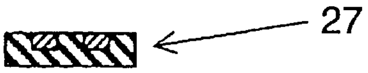

FIG. 3C illustrates a cross section of the electrode frame 24. Then, the electrode frame 24 is placed on a dielectric sheet 26 and pressed together from both, upper and lower, sides as denoted by arrows in FIG. 3D. As a result shown in FIG. 3E, the electrode frame 24 is embedded into the dielectric sheet 26. Then, the sheet is divided into resonator dielectric substrates 27 as shown in FIG. 3F.

Figure 4A:
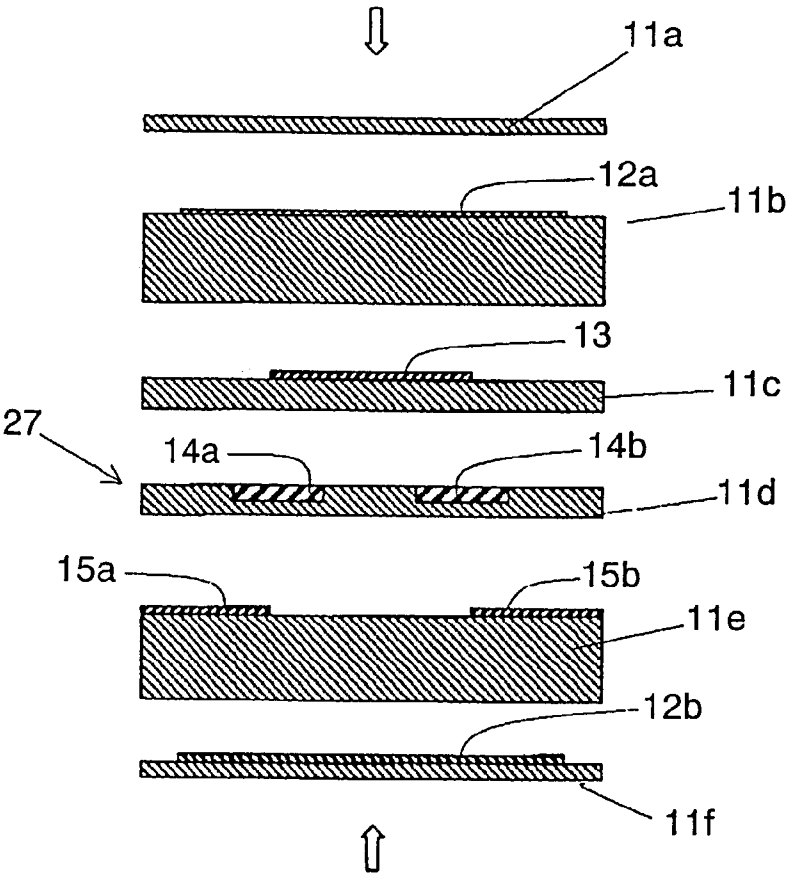
FIGS. 4A and 4B illustrate a procedure of manufacturing the dielectric filter according to Embodiment 2.
Figure 4B:
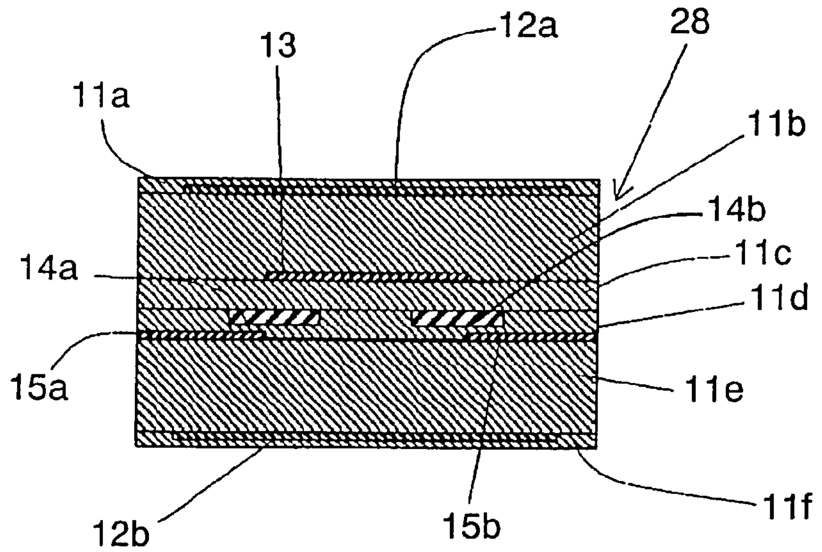

FIG. 4A and FIG. 4B illustrate a procedure of manufacturing a dielectric filter with the resonator dielectric substrate 27 (identical to the substrate 11*d* shown in FIG. 1) having resonator electrodes 14*a* and 14*b* of metallic foil. The procedure will be described while like elements are denoted by like numerals as those shown in FIG. 1.

In FIG. 4A, a protective-ceramic-dielectric substrate 11*a* as a protective layer, a shield electrode ceramic dielectric substrate 11*b* with a shield electrode 12*a*, an inter-stage coupling capacitor ceramic dielectric substrate 11C with an inter-stage coupling capacitor electrode 13, a resonator-ceramic-dielectric substrate 11*d* with resonator electrodes 14*a* and 14*b* of metallic foil embedded therein prepared by the procedure in FIGS. 3A to 3F, an input/output coupling capacitor ceramic dielectric substrate 11*e* with input/output coupling capacitor electrodes 15*a* and 15*b*, and a shield electrode ceramic dielectric substrate 11*f* with a shield electrode 12*b* are laminated one over another and pressed together in direction denoted by arrows. This provides a dielectric substrate assembly 28 shown in FIG. 4B. The dielectric substrate assembly 28 is fired in a reducing atmosphere at a temperature of 900° C. to have a layered ceramic dielectric filter.

According to the present embodiment, each dielectric ceramic substrate having a high dielectric constant may be made of Bi—Ca—Nb—O base, Ba—Ti—O base, [Zr(Mg, Zn, Nb)]$TiO_4$+$MnO_2$ base, and Ba—Nd—Ti—O mixture dielectric material. A portion forming no capacitance may be made of forsterite or alumina borosilicate glass.

Embodiment 3

Embodiment 3 is differentiated from Embodiment 2 in that a dielectric substrate including a resonator electrode of metallic foil embedded therein is made of composite material containing thermoset resin such as epoxy resin and inorganic filler of powder of $Al_2O_3$ or MgO.

The thermoset resin of the composite material may be made of not only epoxy resin, but also phenol resin and cyanate resin.

Figure 5A:
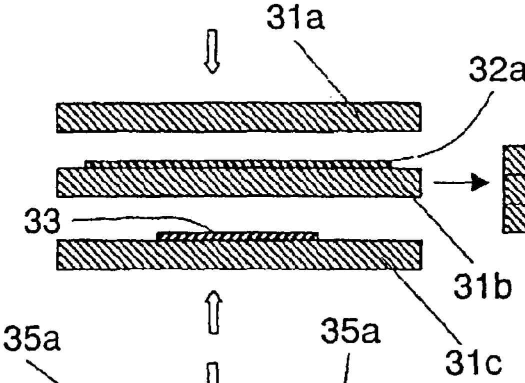
FIGS. 5A to 5F illustrate a procedure of manufacturing a dielectric filter according to Embodiment 3 of the invention.
Figure 5B:
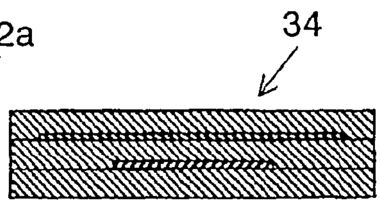
Figure 5C:
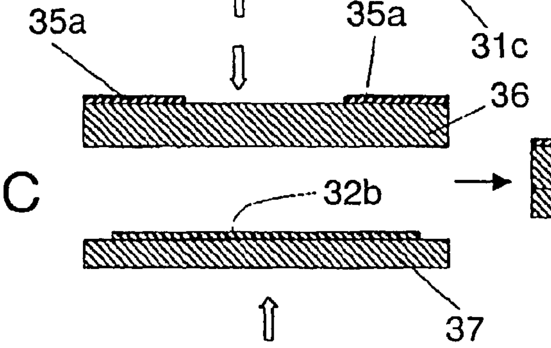
Figure 5D:
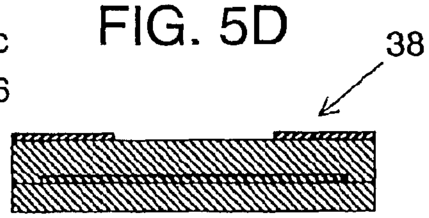

FIGS. 5A to 5F are schematic diagrams essentially illustrating a method according to this embodiment. As shown in FIG. 5A, a protective-ceramic-dielectric substrate 31*a* as a protective layer in green-sheet form, a shield electrode ceramic dielectric substrate 31*b* in green-sheet form having a shield electrode 32*a*, and an inter-stage coupling capacitor ceramic dielectric substrate 31*c* in green-sheet form having an inter-stage coupling capacitor electrode 33 are laminated and pressed together in directions denoted by arrows. The laminated substrates are then fired at about 900° C. to develop a first dielectric block 34 shown in FIG. 5B. Then, as shown in FIG. 5C, an input/output coupling capacitor ceramic dielectric substrate 36 in green-sheet form having input/output coupling capacitor electrodes 35*a* and 35*b* and a shield electrode ceramic dielectric substrate 37 in green-sheet form having a shield electrode 32*b* are laminated and pressed. The laminated substrates are then fired at about 900° C. to develop a second dielectric block 38 shown in FIG. 5D.

Figure 5E:
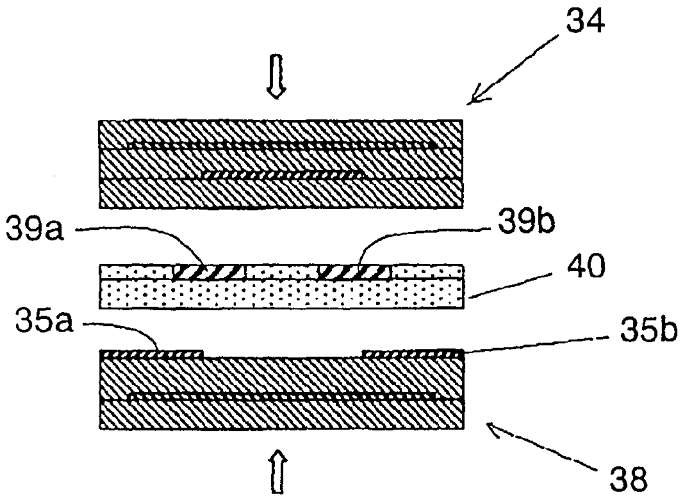
Figure 5F:
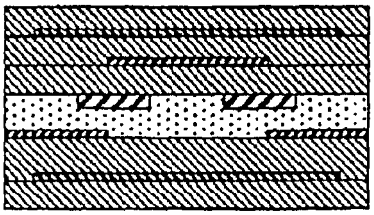

Then, a resonator-composite-dielectric substrate 40, which is manufactured by the processes described in FIGS. 3A to 3F, having resonator electrodes 39*a* and 39*b* embedded therein is placed between the first dielectric block 34 and the second dielectric block 38 as shown in FIG. 5E, and pressed together in directions denoted by arrows. The substrate 40 includes the input/output coupling capacitor electrodes 35*a* and 35*b* embedded in the lower surface thereof. The substrates is heated at a temperature ranging from 150 to 200° C. for curing the composite material, thus causing the first dielectric block 34, the resonator composite dielectric substrate 40, and the second dielectric block 38 to be joined together to provide a dielectric filter shown in FIG. 5F.

For improving a performance of the filter, the resonator-composite-dielectric substrate 40 may contains a high content of dielectric ceramic powder having a high dielectric constant as the inorganic filler selected from not only $Al_2O_3$ and MgO, but also Bi—Ca—Nb—O, Ba—Ti—O, [Zr(Mg, Zn, Nb)]$TiO_4$+$MnO_2$, and Ba—Nd—Ti—O mixtures.

The resonator electrodes 39*a* and 39*b* of a metallic foil of this embodiment, since being embedded in the composite substrate containing resin, allows the dielectric filter to be manufactured by simple processes shown in FIGS. 5A to 5F.

The inorganic filler in the composite material in this embodiment may be preferably contained about 70% to 90% for the composite material to have an identical thermal expansion to the ceramic material.

For increasing the dielectric constant of the composite material, more filler may be used. For a bonding strength, the filler may be used in an amount less than the above range.

The resonator has the Q factor significantly increased by the electrodes of metallic foil having a high conductor Q factor, and the dielectric substrate having a high material Q factor.

The dielectric filter of Embodiment 3 features the resonator electrodes 39*a* and 39*b* embedded in the dielectric material having a low dielectric constant. Each electrode touches the material having a high dielectric constant at its upper and lower surfaces, and touches the material having a high dielectric constant at its sides.

The dielectric filter of Embodiment 3 has an electrode, such as capacitor coupling electrode or input/output electrode, in the material of a high dielectric constant, however has the same advantage even if the material of the high dielectric constant does not include the electrode. In order to include the electrode, the dielectric material is fired together with the electrode. However, the dielectric material, namely a low temperature co-fired ceramic (LTCC), which can be fired together with the electrode, has a substantially low Q factor (the material Q factor). According to Embodiment 4, the resonator electrodes are disposed to contact directly with a high-temperature fired ceramic, which has a high Q factor but cannot be fired together with the electrode, thus having a high Q factor. The dielectric material, upon excluding the electrode, provides the dielectric filter with the advantage of the HTCC, i.e., the high material Q factor.

Embodiment 4

Figures 6A, 6B, 6C, 6D:
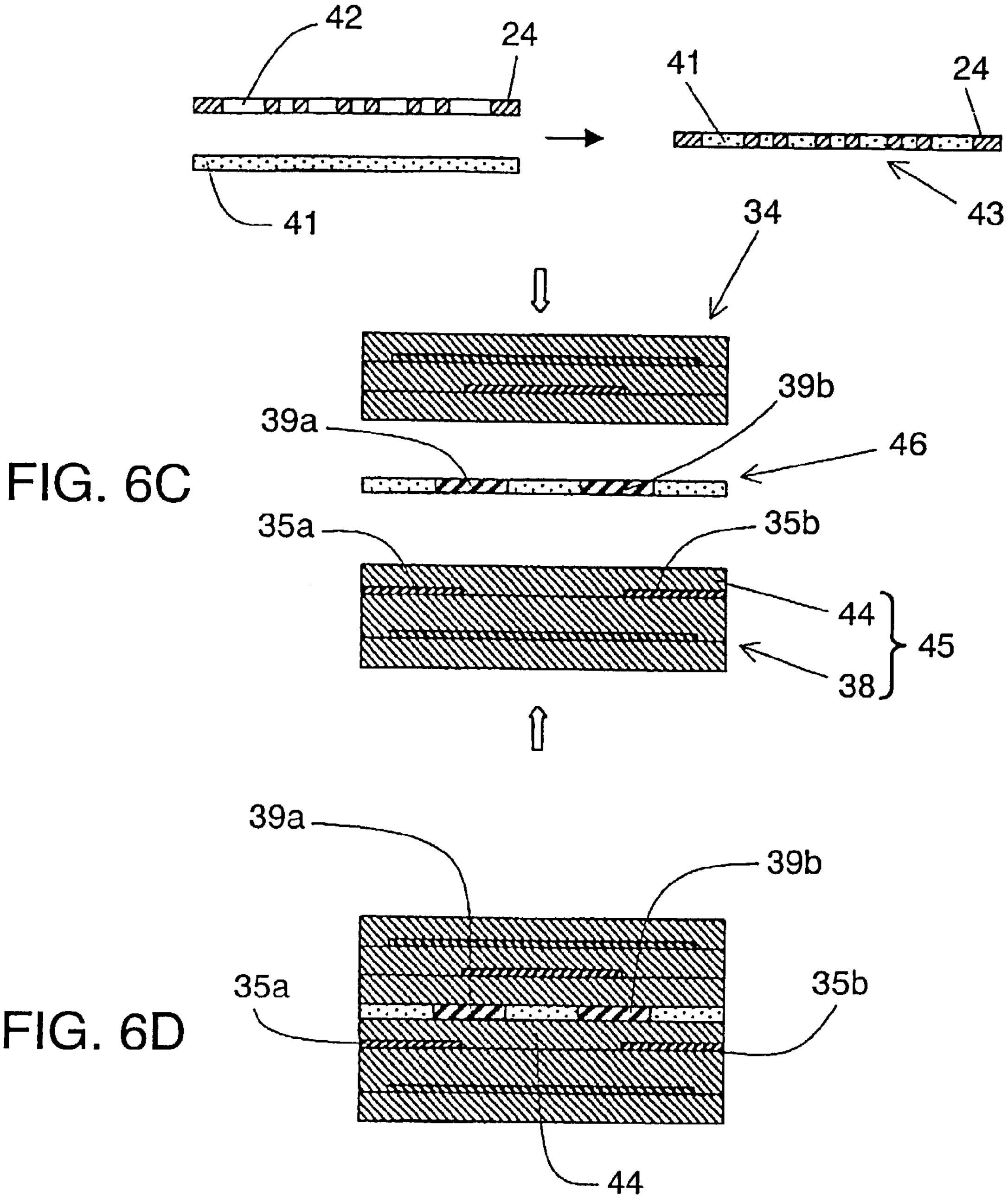
FIGS. 6A to 6D illustrate a procedure of manufacturing a dielectric filter according to Embodiment 4 of the invention.

A dielectric filter according to Embodiment 4 of the present invention is manufactured by the following method. As shown in FIG. 6A, an electrode frame 24 made by the manner shown in FIGS. 3A to 3F is pressure-bonded to a composite material 41 having the same thickness as the electrode frame 24. As a result shown in FIG. 6B, openings 42 in the electrode frame 24 are filled with the composite material 41 thus forming an electrode composite substrate 43.

Then, a dielectric substrate 44 of ceramic material having a high dielectric constant in green-sheet form is placed on the upper surface of a second dielectric block 38 in green-sheet form manufactured by the manner shown in FIG. 5C, and fired under the same condition as of Embodiment 3 to develop a third dielectric block 45. As shown in FIG. 6C, a resonator-composite-dielectric substrate 46 separated from the electrode-composite substrate 43 is placed between the third dielectric block 45 and a first dielectric block 34 manufactured by the manner shown in FIG. 5B. They are then pressed together to form a dielectric filter shown in FIG. 6D. The filter includes the dielectric substrate 44 having a high dielectric constant positioned between input/output coupling capacitor electrodes 35*a* and 35*b* and resonator electrodes 39*a* and 39*b*, thus having an improved Q factor even being manufactured by an inexpensive process. The resonator has the Q factor significantly increased by the electrodes of metallic foil having a high conductor Q factor, and the dielectric substrate having a high material Q factor.

The dielectric filter of Embodiment 4 features the resonator electrodes 39*a* and 39*b* embedded in the dielectric material having a low dielectric constant. Each electrode touch the material having a high dielectric constant at its upper and lower surfaces, and touch the material having a high dielectric constant at its sides.

Instead of the composite substrate 43, the filter of this embodiment may be manufactured by a method of, at the process shown in FIG. 6C, providing the resonator electrodes 39*a* and 39*b* directly on the upper surface of the third dielectric block 45, filling the openings 42 of the electrode frame 24 with liquid resin such as epoxy, phenol, cyanate, poly-phenylene-phthalate, or poly-phenylene-ether resin as adhesive, and then bonding the dielectric block 34 from above. They may be bonded with paste of glass flit, instead of the resin adhesive, with which the openings 42 of the electrode frame 24 are filled, and fired at about 900° C. for being glass-sealed.

At the processes shown in FIGS. 3A to 3E, FIG. 6A, and FIG. 6B, the plural resonator electrodes are obtained in the electrode frame at once. At the other processes, each dielectric filter is illustrated for a simple explanation.

The resonator electrode of metallic foil of the foreging embodiments is polished or metal-plated at its surface by Au, Ag, or Cu in order to have an average surface roughness ranging 0.5 to 0.01 μm. The resonator electrode, since having a smoother surface than an electrode made by a conventional conductive paste printing process which provides an average surface roughness ranging 1 to 3 μm, has an increased Q factor, thus improving a performance of the filter.

The dielectric filter of Embodiment 4 has an electrode such as capacitor coupling electrode or input/output electrode in the material of a high dielectric constant, however has the same advantage even if the material of the high dielectric constant does not include the electrode. In order to include the electrode, the dielectric material is fired together with the electrode. However, the dielectric material, namely a low temperature co-fired ceramic (LTCC), which can be fired together with the electrode has a substantially low Q factor (the material Q factor). According to Embodiment 4, the resonator electrodes are disposed to contact directly with a high-temperature fired ceramic, which has a high Q factor, but cannot be fired together with the electrode, thus having a high Q factor. The dielectric material, upon excluding the electrode, provides the dielectric filter with the advantage of the HTCC, i.e., the high material Q factor.

The resonator of Embodiment 4 includes a couple of the resonator electrodes of metallic foil, however provides the filter with the same effect upon including three or more resonator electrodes.

The conventional resonator electrode formed with a printed pattern of conductive paste are limited in a thickness. The resonator electrode of this embodiment made of metallic foil, since being able to be manufactured by hotolithographic process and etching process, has a desired thickness according to desired characteristics and has a reduced conductor loss. The filter with the electrode allows a communication apparatus to be small and to have a high performance.

Embodiment 5

Figure 7:
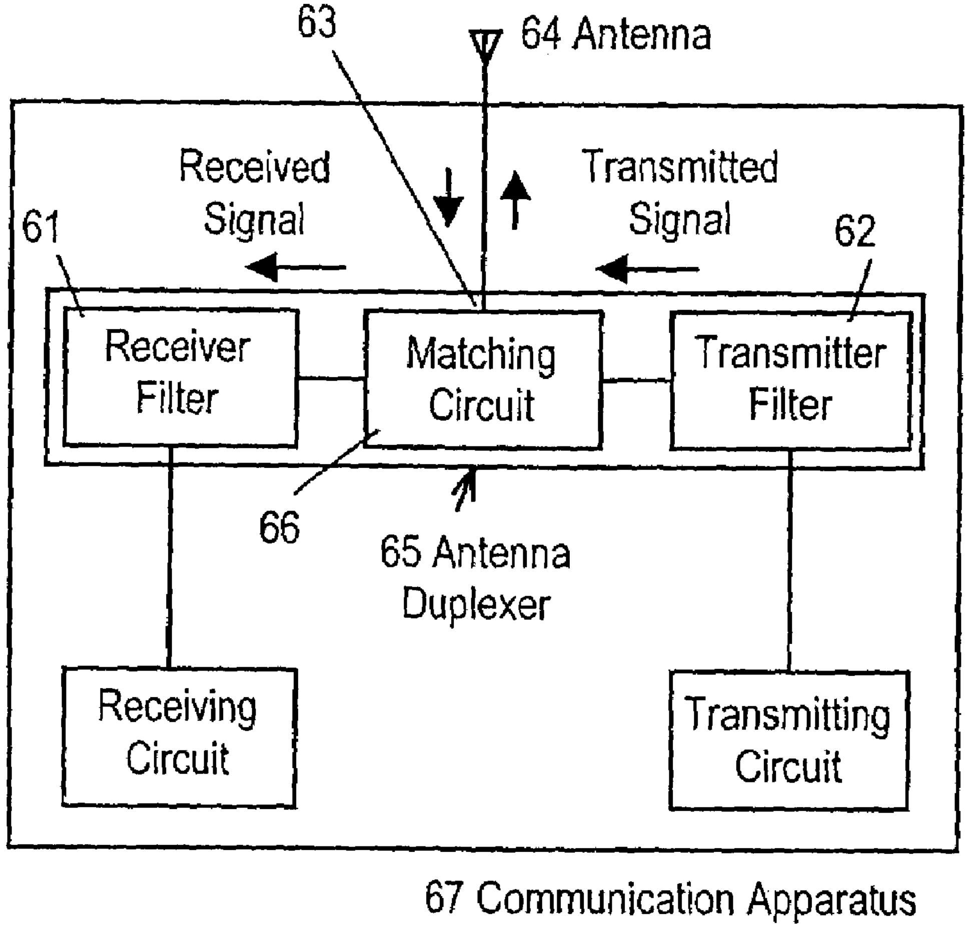
FIG. 7 is a schematic block diagram of a communication apparatus including an antenna duplexer and according to Embodiment 5 of the invention.

This embodiment relates to an antenna duplexer 65 including the dielectric filter of Embodiments 1 to 4 as a transmitter filter 62 or a receiver filter 61 for separating a signal into a received signal and a transmitted signal in a communication apparatus 67 such as mobile telephone. As shown in FIG. 7, the dielectric filters of the foregoing embodiment are connected to respective ends of a matching circuit 66 having an antenna port 63 linked to an antenna 64. This eliminates a coaxial resonator, which occupies a large space, commonly used in a conventional antenna duplexer. The antenna duplexer of this embodiment has reduced overall dimensions.

The antenna duplexer of this embodiment, since including the dielectric filter having a resonator electrode made of metallic foil, can contribute to the smaller size and the improved performance of the communication apparatus such as mobile telephone.

The resonator electrode of the dielectric filter in the antenna duplexer, since having a surface smoothed by polishing or metal-plating, has a high Q factor.

The resonator electrode of the dielectric filter in the antenna duplexer is manufactured with an electrode frame formed by the processes of photo-masking and etching both surfaces of a metal foil sheet containing gold, silver, or copper and then rounding its edges and corners by chemical or electrolytic polishing. As a result, the resonator electrodes can have the rounded edges and corners.

Embodiment 6

Figure 8:
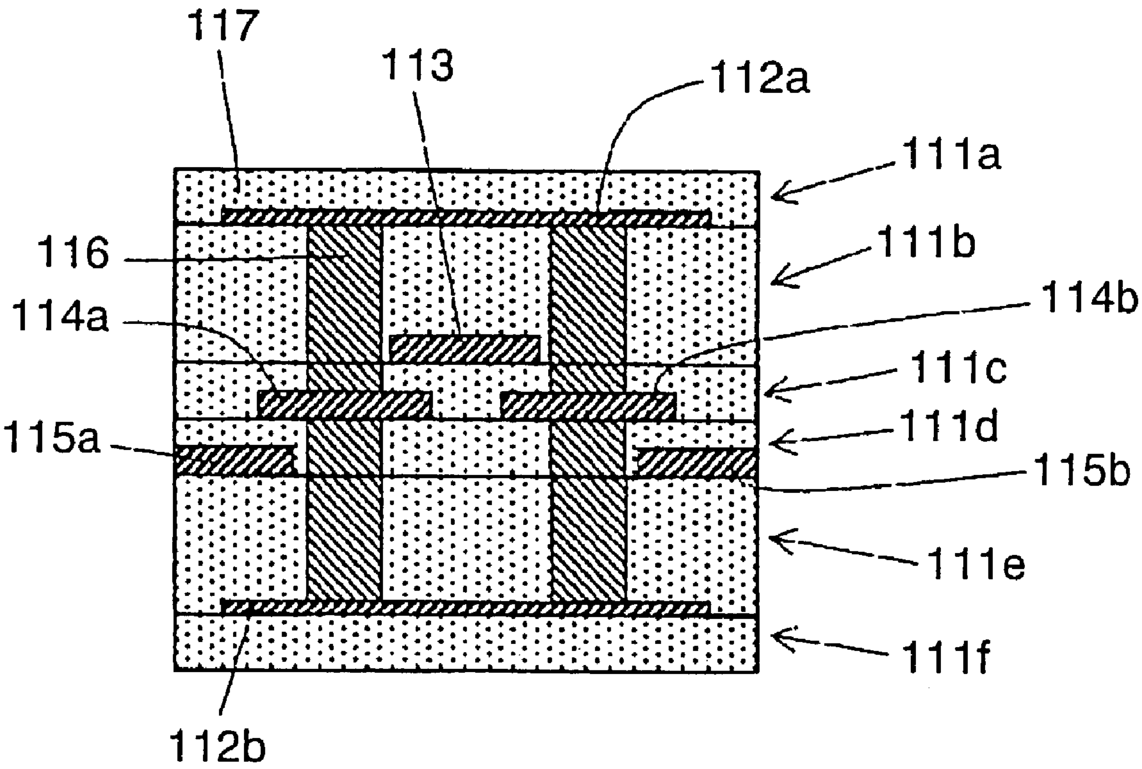
FIG. 8 is a cross sectional view of a dielectric filter according to Embodiment 6 of the invention.

FIG. 8 is a cross sectional view of a dielectric filter according to Embodiment 6 of the present invention. The dielectric filter having a similar basic arrangement to that shown in FIG. 17 includes six dielectric substrates 111*a* to 111*f*.

Figure 18:
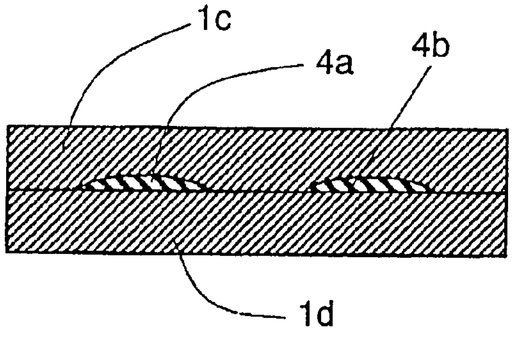
FIG. 18 is a cross sectional view of a resonator electrode provided in the conventional dielectric filter.
Figure 5A:
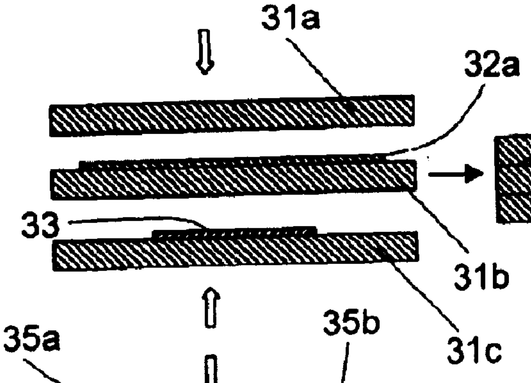
Figure 5B:
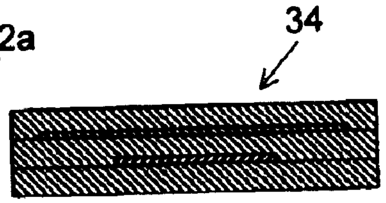
Figure 5C:
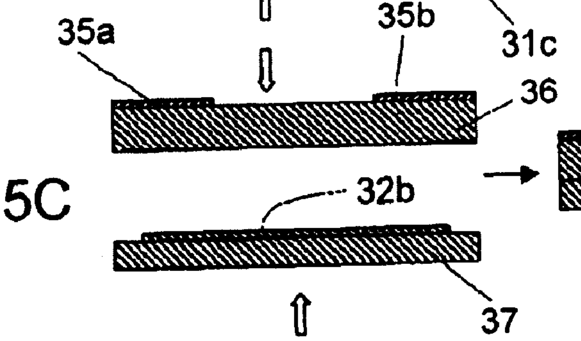
Figure 5D:
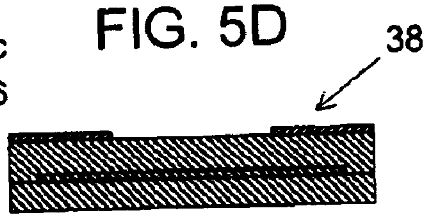
Figure 5E:
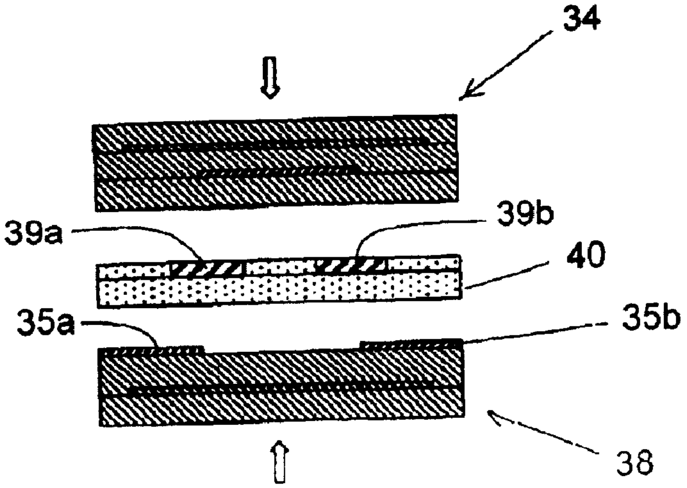
Figure 5F:
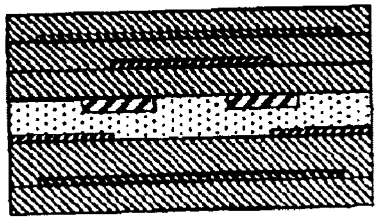
Figure 10A:
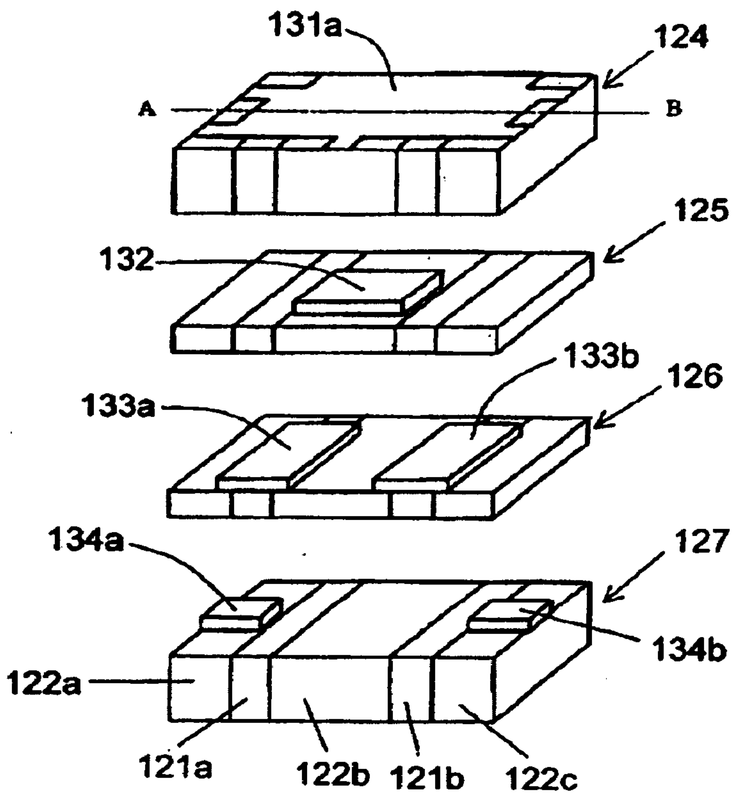
Figure 10B:
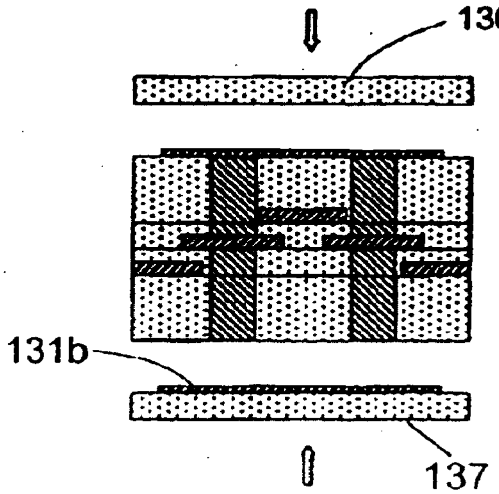
Figure 10C:
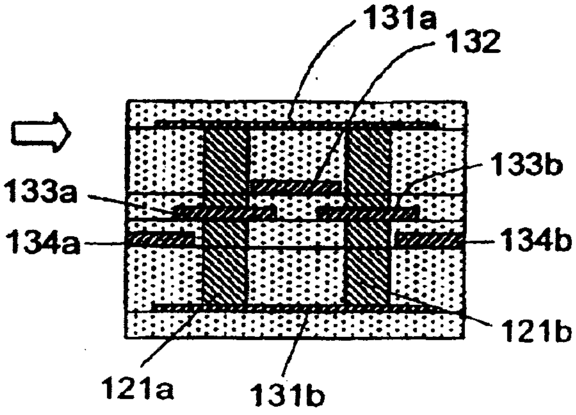
Figure 17:
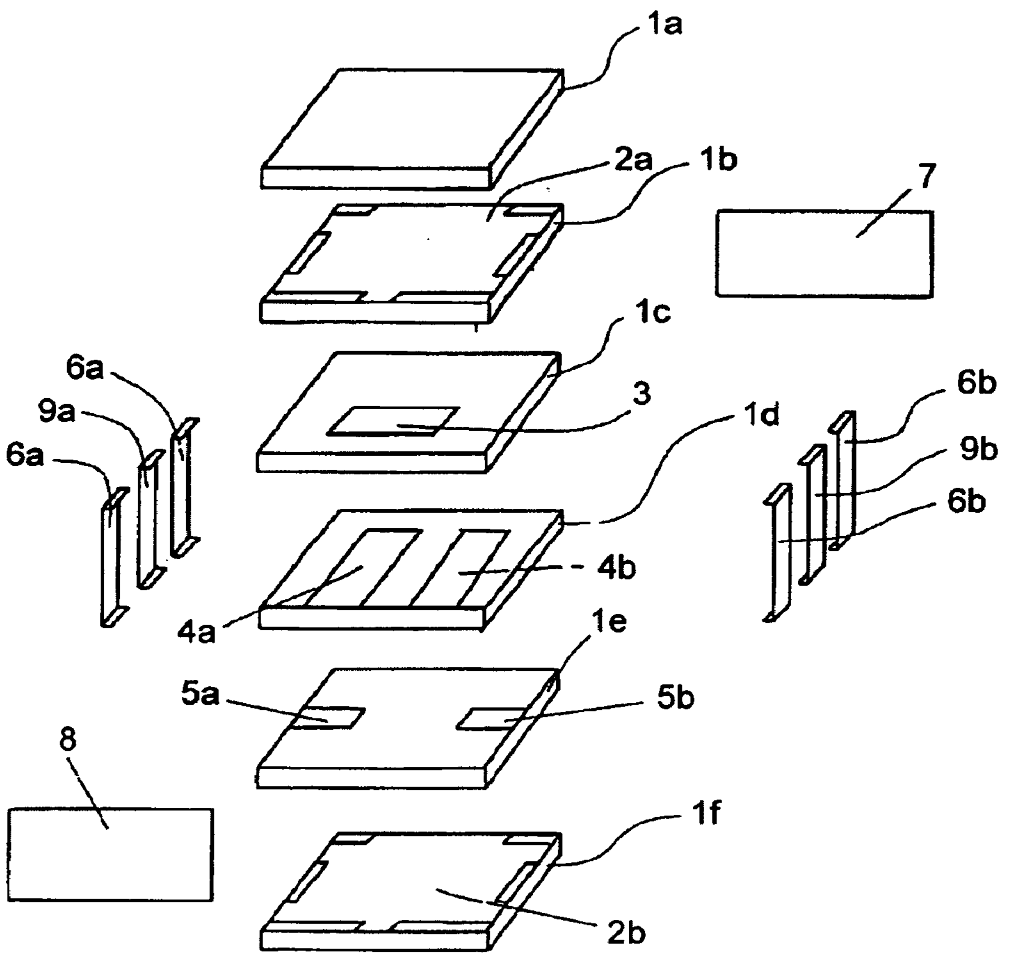
FIG. 17 PRIOR ART
Figure 18:
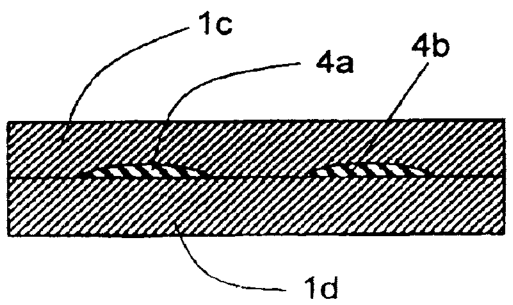
FIG. 18 PRIOR ART

Electrodes in the dielectric filter may be manufactured with the same conductive material as that of the conventional filter. Each electrode in this embodiment has a rectangular cross section as shown in the cross sectional view of FIG. 8 for a simple explanation. The cross section may be any appropriate shape such as a bobbin shape shown in FIG. 18 and may be provided by printing a pattern of conductive paste.

The upper shield electrode dielectric substrate 111*b* includes a shield electrode 112*a* on the upper surface thereof. The inter-stage coupling capacitor dielectric substrate 111*c* includes an inter-stage coupling capacitor electrode 113 on the upper surface thereof. The resonator dielectric substrate 111*d* includes resonator electrodes 114*a* and 114*b* on the upper surface thereof. The input/output coupling capacitor dielectric substrate 111*e* includes input/output coupling capacitor electrodes 115*a* and 115*b* on the upper surface thereof. The lower shield electrode dielectric substrate 111*f* includes a shield electrode 112*b* on the upper surface thereof. The substrates 111*b* to 111*f* are laminated together with the protective substrate 111*a* at the uppermost to provide the dielectric filter of this embodiment. The protective substrate 111*a* may be made of other material than dielectric material, for example, organic material which can protect the shield electrodes from ambient conditions.

Figure 17:
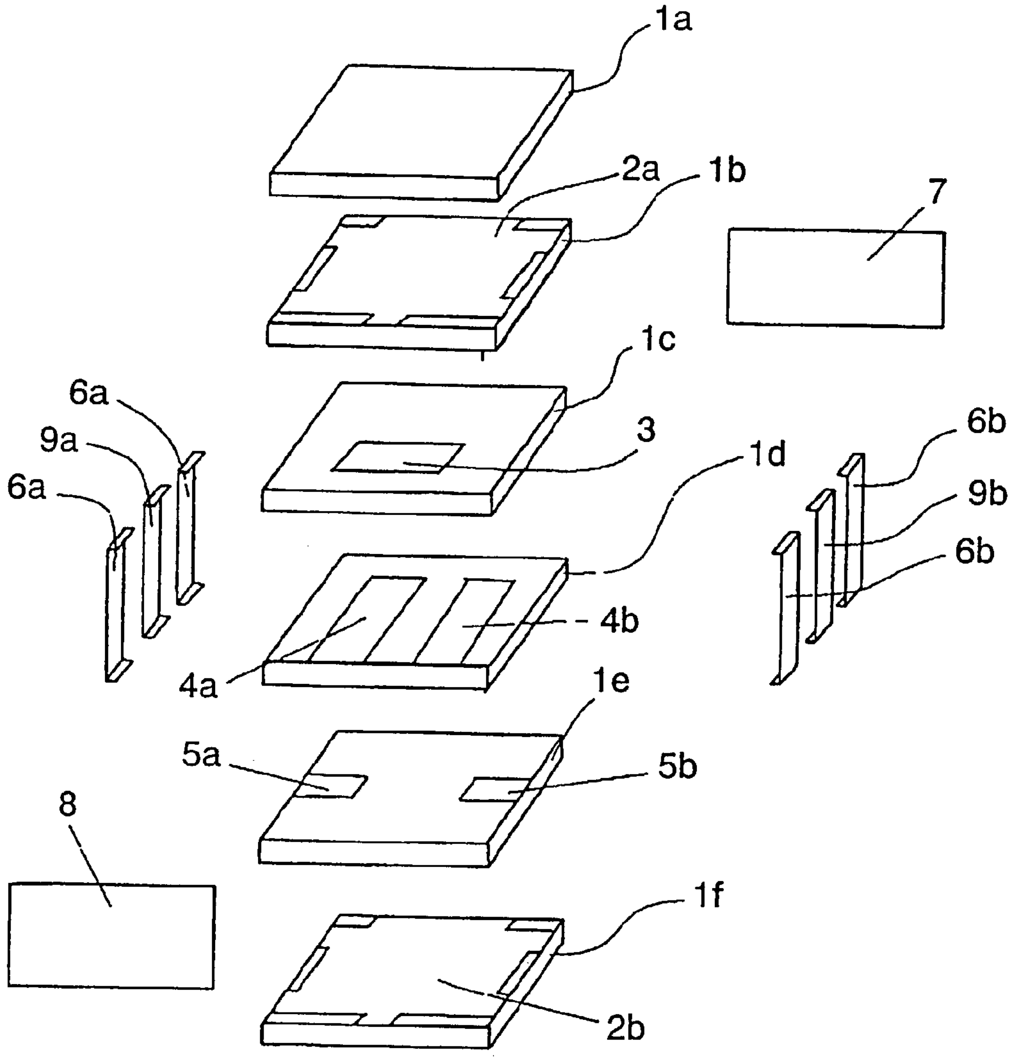
FIG. 17 is an exploded perspective view of the conventional dielectric filter.

The dielectric filer of this embodiment shown in FIG. 8 has end electrodes, as shown in FIG. 17, on left and right sides thereof, which is not illustrated and explained.

The dielectric filter of this embodiment features an arrangement of the substrates. As shown in FIG. 8, each of the upper shield electrode dielectric substrate 111*b*, the inter-stage coupling capacitor dielectric substrate 111*c*, the resonator dielectric substrate 111*d*, and the input/output coupling capacitor dielectric substrate 111*e* is made of materials having different dielectric constants, including a first dielectric material 116 having a high relative dielectric constant (referred to as a high-dielectric-constant material hereinafter) and a second dielectric material 117 having a lower relative dielectric constant than the first dielectric material (thus referred to as a low-dielectric-constant material hereinafter). In particular, the high-dielectric-constant material and the low-dielectric-constant material are arranged alternately along the crosswise direction.

Accordingly, the high-dielectric-constant material 116 is located at the center of each of the resonator electrodes 114*a* and 114*b* in the dielectric filter. The low-dielectric-constant material 117 is located on the outer side of each of the resonator electrodes 114*a* and 114*b*. This locates electric flux lines uniformly on the resonator electrodes 114*a* and 114*b*. The lines are scattered near each end of the electrodes in a conventional dielectric filter. A current density across the resonator electrodes 114*a* and 114*b*, since being uniform, reduces a conductor loss of the resonator electrodes 114*a* and 114*b*, thus reducing a loss in the dielectric filter.

In the dielectric filter of this embodiment, each overlapped region between the resonator electrodes 114*a* and 114*b* and the inter-stage coupling capacitor electrode 113 and each overlapped region between the input/output coupling capacitor electrodes 115*a* and 115*b* and the inter-stage coupling capacitor electrode 113 are filled with the low-dielectric-constant material 117. This allows capacitances and characteristics of the filter to be designed easily.

Embodiment 7

Figure 9A:
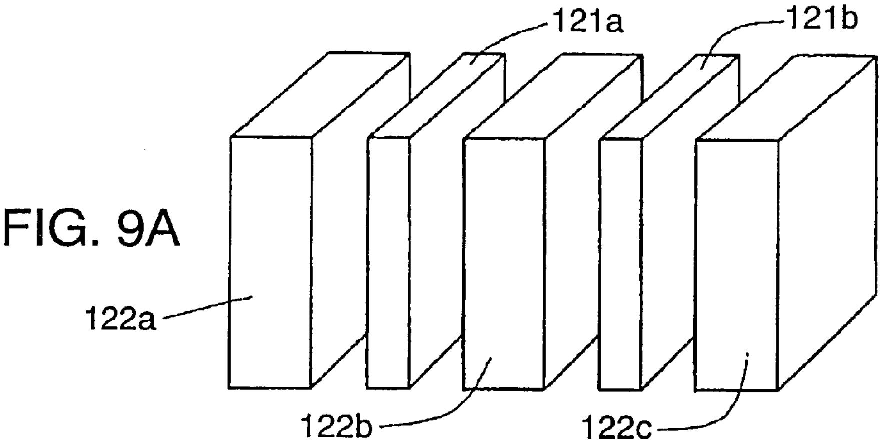
FIGS. 9A to 9C illustrate a procedure of manufacturing a dielectric filter according to Embodiment 7 of the invention.
Figure 9B:
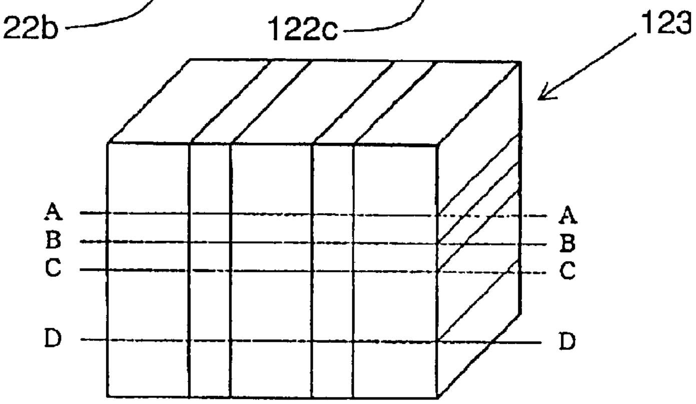
Figure 9C:
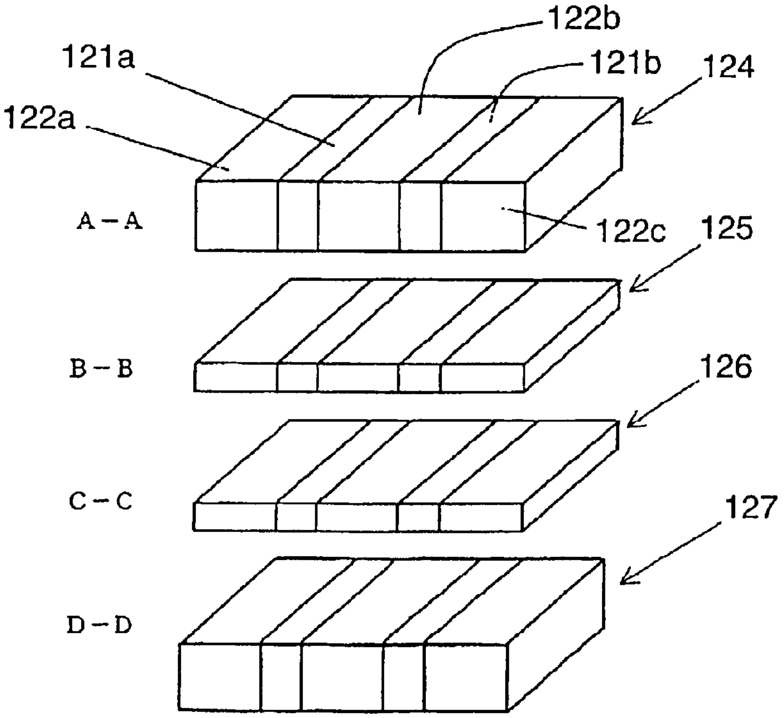

FIGS. 9A to 9C illustrate processes of manufacturing a composite ceramic dielectric substrate according to Embodiment 7 of the present invention. As shown in FIG. 9A, green sheets 121*a* and 121*b* made of Bi—Ca—Nb—O ceramic material having a high dielectric constant and green sheets 122*a*, 122*b*, and 122*c* made of forsterite ceramic material having a low dielectric constant are alternately laminated. Each of the green sheets 121*a* and 122*b* includes ceramic green layers each having a thickness of a few micrometers to hundreds micrometers manufactured by a doctor-blade method with slurry containing powder of dielectric material and organic binder.

A composite ceramic dielectric block 123 (referred to as a green sheet block hereinafter) of the green sheets 121*a* and 122*b* is sliced along lines A—A, B—B, C—C, and D—D as shown in FIG. 9B. This provides four composite ceramic dielectric green substrates 124 to 127 as shown in FIG. 9C. Each substrate includes two different dielectric materials, including ceramic having a high relative dielectric constant and ceramic having a low relative dielectric constant.

Figure 10A:
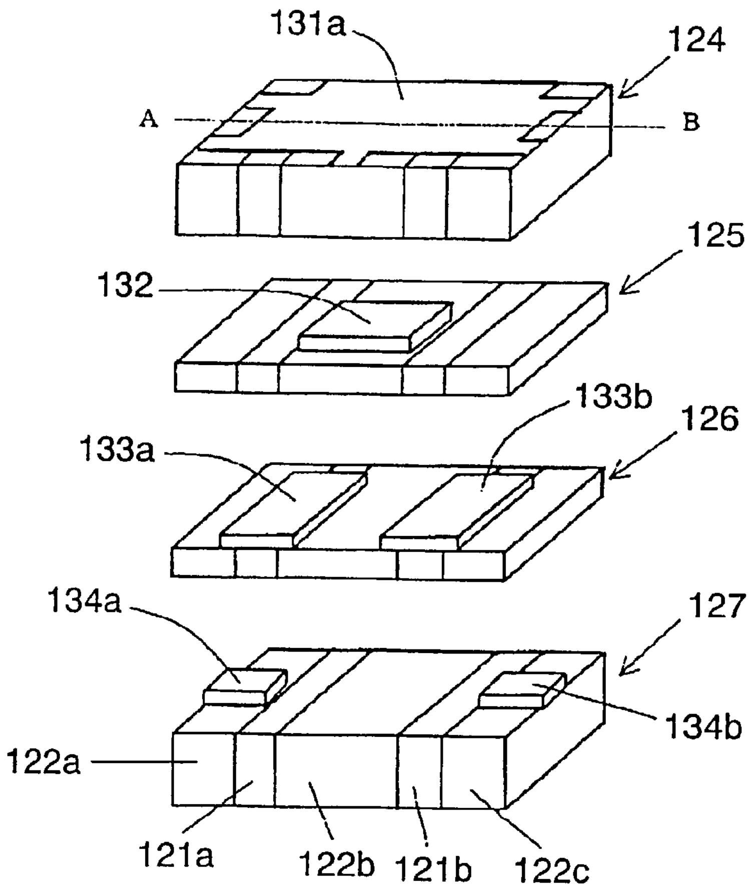
FIGS. 10A to 10C illustrate a procedure of manufacturing the dielectric filter according to Embodiment 7.
Figure 10B:
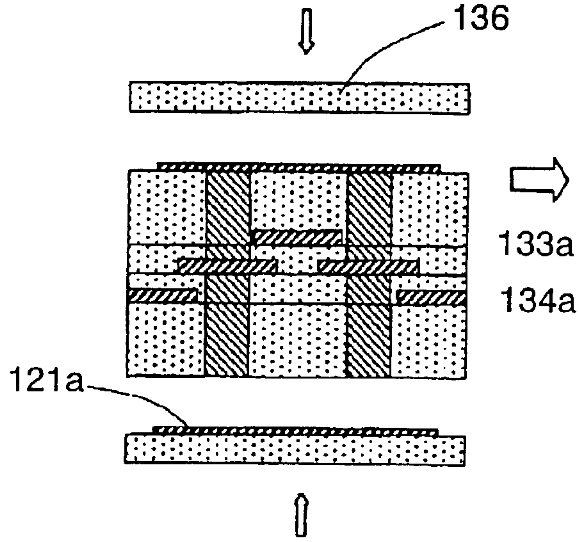
Figure 10C:
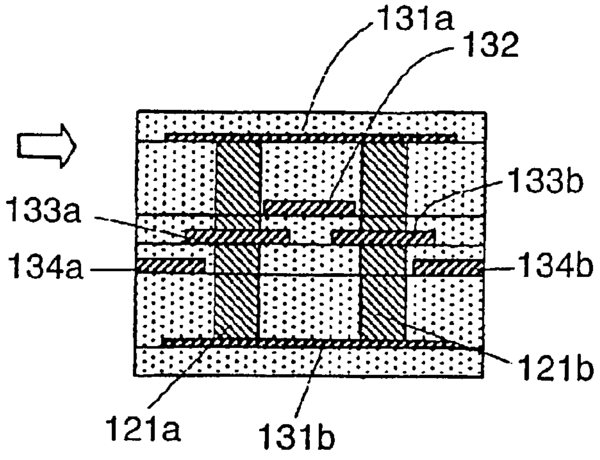

FIGS. 10A to 10C are perspective views showing latter processes of manufacturing the dielectric filter of this embodiment. As shown in FIG. 10A, an upper shield electrode 131*a* is provided on the upper surface of the ceramic dielectric green substrate 124. An inter-stage coupling capacitor electrode 132 is provided on the upper surface of the ceramic dielectric green substrate 125. Resonator electrodes 133*a* and 133*b* having one end as a short-circuit end and the other end as an open end are provided on the upper surface of the ceramic dielectric green substrate 126. Input/output coupling capacitor electrodes 134*a* and 134*b* are provided on the upper surface of the ceramic dielectric green substrate 127. They are then laminated together and covered, on respective upper and lower sides thereof, with a protective ceramic green substrate 136 and a ceramic dielectric green substrate 137 which includes a lower shield electrode 131*b* provided thereon, as shown in FIG. 10B. They are then pressed and fired at a predetermined temperature, thus providing the dielectric filter shown in FIG. 10C.

The protective green substrate 136 and the ceramic dielectric green substrate 137 with the lower shield electrode 131*b* shown in FIGS. 10A to 10C are made of the same material as the ceramic material 122*a* having the low dielectric constant. They may be made of ceramic material having a high dielectric constant. The resonator electrode in the dielectric filter of this embodiment has one end as the short-circuit end and the other end as the open end. However, the ends may be open ends.

The ceramic dielectric green substrates 124, 125, 126, and 127 of this embodiment shown in FIGS. 9A to 9C and FIGS. 10A to 10C are formed with the green sheet block 123 slices to desired thicknesses. The substrates may be formed with respective green sheet blocks, each including two different dielectric materials. The portions of the high dielectric constant in each ceramic dielectric green substrate may have different widths in the cross section from each other. This allows the dielectric filter to be designed flexibly.

The electrodes provided on the dielectric green substrates may be prepared with printed patterns of conductive paste or etched metallic foils. The ceramic dielectric green substrates with the electrodes may be fired under desired conditions.

The former procedure of Embodiment 7 is explained where the green sheet block 123 is divided into the ceramic dielectric green substrates 124, 125, 126, and 127, which are then provided with the electrodes, laminated, and fired. The procedure may be modified in which the ceramic dielectric green substrates 124, 125, 126, and 127 obtained from the green sheet block 123 may be fired, and then provided with the electrodes. The modified procedure prevents the substrates from cracks occurring during the firing.

The fired ceramic dielectric substrates in the modified procedure may be bonded together with adhesive selected from thermoset resin, composite material containing thermoset resin and inorganic filler, and glass flit having a low melting temperature, and the like.

As described, the dielectric filter of this embodiment features the laminated composite dielectric substrates made of composite materials having different relative dielectric constants. Therefore, the dielectric filter may includes substrates selected from the composite dielectric substrate and the dielectric substrate having a single relative dielectric constant according to a desired shape and desired characteristics.

Embodiment 8

Figure 11:
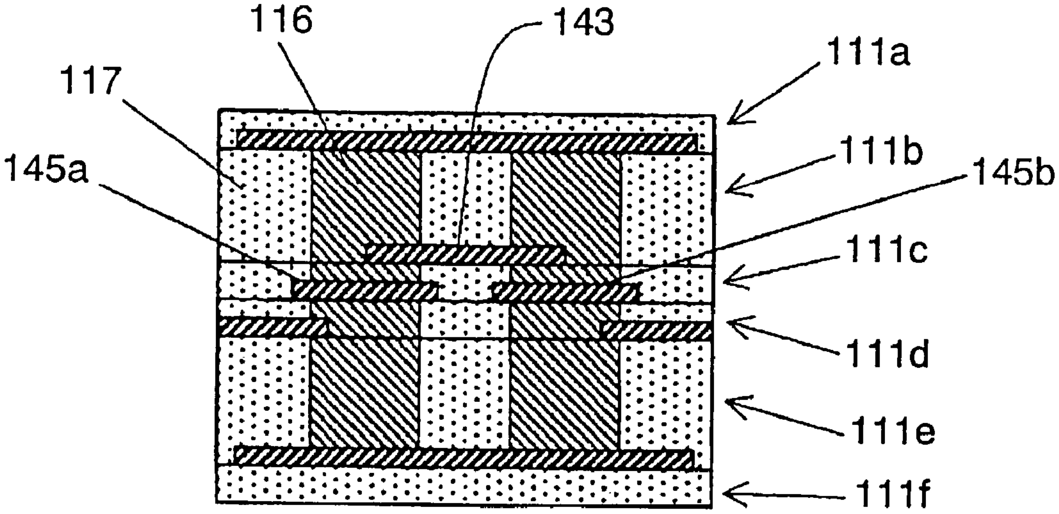
FIG. 11 is a cross sectional view of a dielectric filter according to Embodiment 8 of the invention.

FIG. 11 is a cross sectional view of a dielectric filter according to Embodiment 8 of the present invention. The dielectric filter of Embodiment 8 is differentiated from that of Embodiment 6 by an modified arrangement of an inter-stage coupling capacitor electrode 143 on an inter-stage coupling capacitor dielectric substrate 111*c* and an input/output coupling capacitor electrodes 145*a* and 145*b* on an input/output coupling capacitor dielectric substrate 111*e*. As shown in FIG. 11, both ends of the inter-stage coupling capacitor electrode 143 and one end of each of the input/ output coupling capacitor electrodes 145*a* and 145*b* are positioned in a high-dielectric-constant material 116. This arrangement allows capacitor portions having capacitances to be positioned in the high-dielectric-constant material, thus increasing the capacitances at the capacitor portions in the dielectric filter.

Embodiment 9

Figure 12:
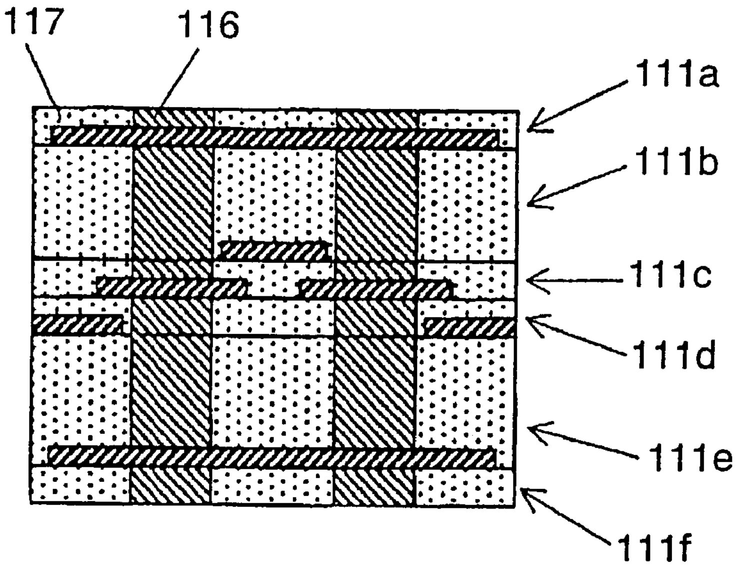
FIG. 12 is a cross sectional view of a dielectric filter according to Embodiment 9 of the invention.

FIG. 12 illustrates a dielectric filter according to Embodiment 9 of the present invention featuring the dielectric substrates 111*a* to 111*f* having a tri-plate construction made of a composite material including a high-dielectric-constant material 116 and a low-dielectric-constant material 117. The dielectric substrates, since being formed with a sliced green sheet block, are manufactured by a simple procedure.

Embodiment 10

Figure 13:
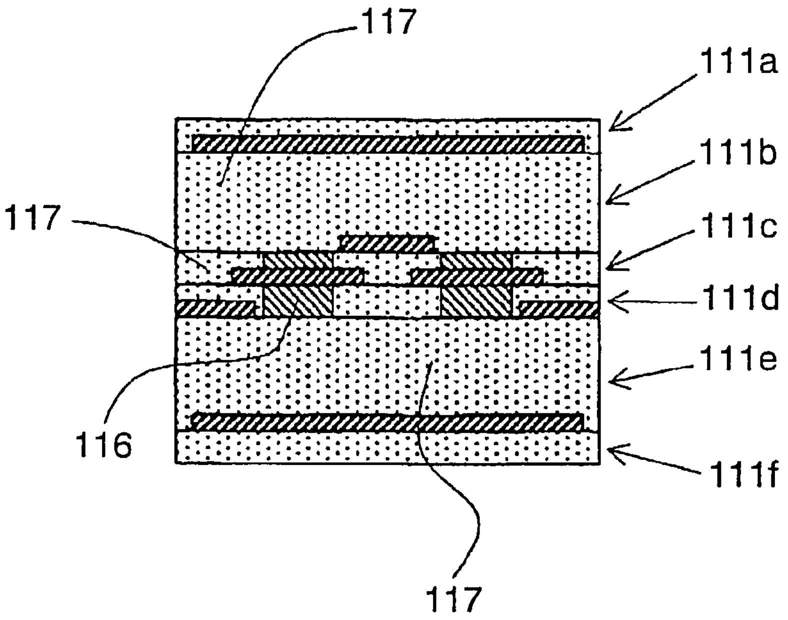
FIG. 13 is a cross sectional view of a dielectric filter according to Embodiment 10 of the invention.

FIG. 13 illustrates a dielectric filter of Embodiment 10 of the present invention. The filter includes an inter-stage coupling capacitor substrate 111*c* and a resonator dielectric substrate 111*d* which are made of a composite material including a high-dielectric-constant material 116 and a low-dielectric-constant material 117. The filter further includes a protective dielectric substrate 111*a*, an upper shield electrode dielectric substrate 111*b*, an input/output coupling capacitor dielectric substrate 111*e*, and a lower shield electrode dielectric substrate 111*f* which are made of the low-dielectric-constant material 117. This arrangement of this embodiment suppresses problems like crack caused after firing due to a difference of contraction between different dielectric materials as compared with the foregoing embodiment where all the dielectric substrates are obtained from a single block.

Figure 14A:
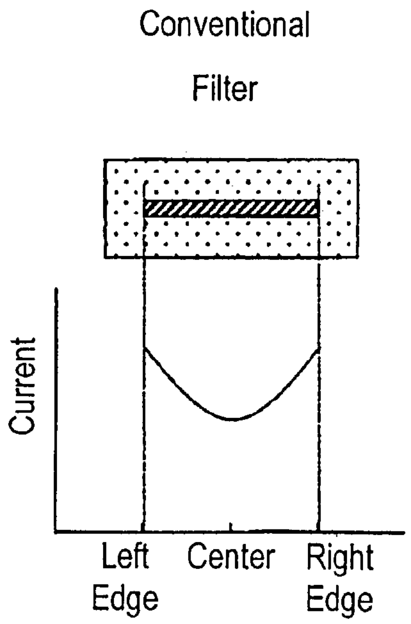
FIGS. 14A and 14B are schematic diagrams illustrating profiles of a current in an electrode of the filter according to the embodiments, and a current in an electrode of a conventional filter.
Figure 14B:
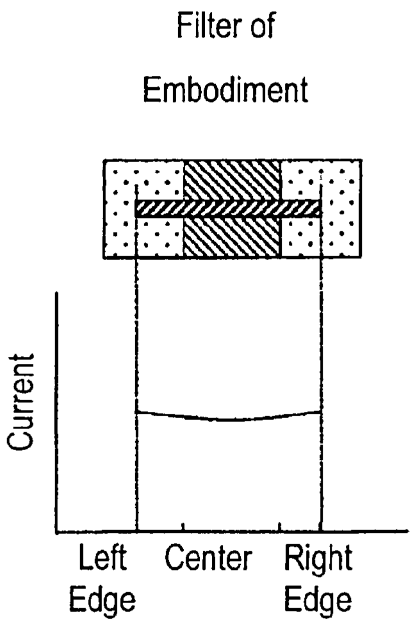

FIGS. 14A and 14B illustrate profiles of a current flowing in a conventional dielectric filter and a current flowing in the dielectric filter of the embodiments in the cross section of the resonator electrode. Electric flux lines, which are generally biased towards both sides of the resonator electrode embedded in a single dielectric material in the conventional dielectric filter, are uniformly aligned along the widthwise direction by the arrangement of this embodiment. This allows the current to flow uniformly through the cross section of the resonator electrode.

Embodiment 11

A dielectric filter according to Embodiment 11 of the present invention is substantially identical to that of the foregoing embodiments except an arrangement of a resonator electrode. A resonator-electrode dielectric substrate will be described referring to a plan view of FIG. 15, while other elements are illustrated in no more detail.

Figure 15:
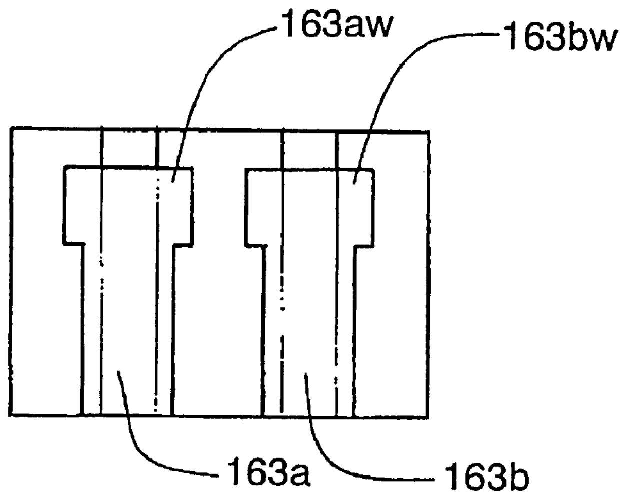
FIG. 15 is a plan view showing the shape of resonator electrodes according to Embodiment 11 of the invention.

Resonator electrode of the dielectric filter of the foregoing embodiments has a rectangular shape with a uniform width. The resonator electrodes 163*a* and 163*b* of this embodiment have wide portions 163*aw* and 163*bw* at respective open ends thereof as shown in FIG. 15. The wide portions 163*aw* and 163*bw* are designed in shape to determine characteristics of the filter.

As shown in the drawing of this embodiment, each of the resonator electrodes 163*a* and 163*b* has the center located on a high-dielectric-constant material, and has both ends including the wide portions 163*aw* and 163*bw* located a low-dielectric-constant material. This arrangement provides the filter with the same advantage as the foregoing embodiments.

In this embodiment, the filter includes two resonator electrodes, and may include three or more resonator electrodes each having the center and both edges located in dielectric materials having different relative dielectric constants, respectively.

Embodiment 12

Figure 16:
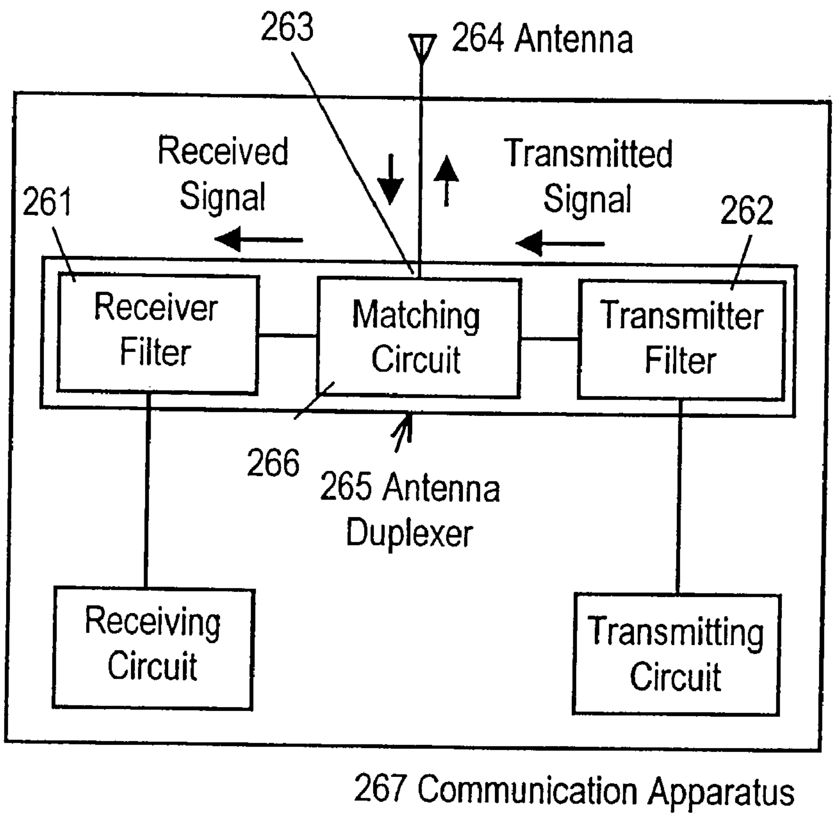
FIG. 16 is a block diagram of a communication apparatus including an antenna duplexer according to Embodiment 12 of the invention.

Embodiment 12 of the present invention relates to an antenna duplexer 265 having a dielectric filter of Embodiments 6 to 11 as a transmitter filter 262 or a receiver filter 261 for separating a signal into a received signal and a transmitted signal in a communication apparatus 267 such as a mobile telephone. As shown in FIG. 16, the antenna duplexer 265 includes the dielectric filters of the foregoing embodiments connected to respective ends of a matching circuit 266 having an antenna port 263 linked to an antenna 264. This arrangement eliminates a coaxial resonator, which occupies a large space, commonly used in a conventional antenna duplexer. The antenna duplexer of this embodiment has reduced overall dimensions.

The antenna duplexer of this embodiment, since including the dielectric filter having a resonator electrode made of metallic foil, can contribute to the smaller size and the improved performance of the communication apparatus such as mobile telephone.

The resonator electrodes, inter-stage coupling capacitor electrodes, and input/output coupling capacitor electrodes of this embodiment may be formed with a printed a pattern of conductive paste containing gold, silver, or copper.

The resonator electrodes, inter-stage coupling capacitor electrodes, and input/output coupling capacitor electrodes of this embodiment may be made of metallic foil essentially containing gold, silver, or copper.

The first dielectric material is not limited to be made of Bi—Ca—Nb—O mixture, but may be selected from a group of ceramic materials including Ba—Ti—O and Zr(Mg, Zn, Nb)Ti—Mn—O. The second dielectric material is forsterite throughout the embodiments. However, it may be alumina borosilicate glass based ceramic material.

The dielectric filter of the embodiments may includes ceramic material of Bi—Ca—Nb—O, Ba—Ti—O, or Zr(Mg, Zn, Nb)Ti—Mn—O as the first dielectric material and a ceramic material of forsterite or alumina borosilicate glass as the second dielectric material, thus having an improved operational reliability and material properties.

The dielectric filter may be manufactured through the following processes:

(a) Joining the first dielectric material in green sheet form and the second dielectric material in green sheet form having lower dielectric constant than the first dielectric material in a crosswise direction to provide the composite ceramic dielectric block in green sheet;

(b) Slicing the composite ceramic dielectric block in green sheet form in the crosswise direction to provide composite dielectric substrates in green sheet form including the first dielectric material and the second dielectric material; and (c) Providing an upper shield electrode, an inter-stage coupling capacitor electrode, resonator electrodes, and an input/output coupling capacitor electrode on respective upper surfaces of the composite dielectric substrates in green sheet form, and then laminating and firing the composite dielectric substrates under specific conditions.

These processes allow the dielectric substrates and the electrodes to be fired at once simply.

INDUSTRIAL APPLICABILITY

A dielectric filter of the present invention includes resonator electrodes which are made of metallic foil having a uniform thickness, are electro-magnetically coupled to each other, and have smooth surfaces. The filter is hence manufactured inexpensively, has an improved Q factor, and has a low loss and high attenuation.

The dielectric filter of the present invention allows a communication apparatus such as a mobile telephone including the filter to have a small size and a high performance.

What is claimed is:

1. A dielectric filter comprising:

a dielectric substrate assembly including a first dielectric substrate, a second dielectric substrate on the first dielectric substrate, and a third dielectric substrate on the second dielectric substrate;

a plurality of resonator electrodes made of metallic foil provided in the dielectric substrate assembly, each of the resonator electrodes having a first surface on the second dielectric substrate, a second surface opposite to the first surface, and a side surface connected to the first surface and the second surface, the resonator electrodes adapted to be electromagnetically coupled with each other;

an inter-stage coupling capacitor electrode provided on the first dielectric substrate, the inter-stage coupling capacitor electrode for coupling the resonator electrodes; and an input/output coupling capacitor electrode provided on the third dielectric substrate, the input/output coupling electrode for inputting and outputting a signal to the resonator electrodes, wherein the dielectric substrate assembly has a first portion located on the first surface of each of the resonator electrodes, a second portion located on the second surface of each of the resonator electrodes, and a third portion located on the side surface of each of the resonator electrodes, and wherein a dielectric constant of the third portion of the substrate assembly is lower than one of a dielectric constant of the first portion of the substrate assembly and a dielectric constant of the second portion of the substrate assembly.

2. A dielectric filter according to claim 1, wherein a dielectric constant of the second dielectric substrate is lower than a dielectric constant of the first dielectric substrate and a dielectric constant of the third dielectric substrate, and wherein the second surface of each of the resonator electrodes contacts one of the first dielectric substrate and the third dielectric substrate.

3. A dielectric filter according to claim 1, wherein the side surface of each of the resonator electrodes contacts the second dielectric substrate.

4. A dielectric filter according to claim 1, wherein each of the resonator electrodes has a short-circuit end at one end and an open end at another end.

5. A dielectric filter according to claim 4, wherein each of the resonator electrodes has a wide portion at the open end thereof.

6. A dielectric filter according to claim 1, wherein each of the resonator electrodes has open ends at both ends.

7. A dielectric filter according to claim 6, wherein each of the resonator electrodes has a wide portion provided at at least one of the open ends thereof.

8. A dielectric filter according to claim 1, wherein the metallic foil contains at least one of gold, silver, and copper.

9. A dielectric filter according to claim 1, wherein each of the resonator electrodes has a cross section having a four-sided shape with corners being rounded and arcuate shaped.

10. A dielectric filter according to claim 1, wherein the resonator electrodes have respective thicknesses ranging from 10 μm to 400 μm.

11. A dielectric filter according to claim 1, wherein the resonator electrodes have respective surfaces thereof polished or metal plated.

12. A dielectric filter according to claim 1, wherein the resonator electrodes have respective average surface roughnesses ranging from 0.5 μm to 0.01 μm.

13. An antenna duplexer comprising:

an antenna port;

a first filter including a dielectric filter and being coupled to the antenna port, the dielectric filter comprising:

a dielectric substrate assembly including a first dielectric substrate, a second dielectric substrate on the first dielectric substrate, and a third dielectric substrate on the second dielectric substrate;

a plurality of resonator electrodes made of metallic foil provided in the dielectric substrate assembly, each of the resonator electrodes having a first surface on the second dielectric substrate, a second surface opposite to the first surface, and a side surface connected to the first surface and the second surface, the resonator electrodes adapted to be electromagnetically coupled with each other;

an inter-stage coupling capacitor electrode provided on the first dielectric substrate, the inter-stage coupling capacitor electrode for coupling the resonator electrodes; and an input/output coupling capacitor electrode provided on the third dielectric substrate, the input/output coupling electrode for inputting and outputting a signal to the resonator electrodes, wherein the dielectric substrate assembly has a first portion located on the first surface of each of the resonator electrodes, a second portion located on the second surface of each of the resonator electrodes, and a third portion located on the side surface of each of the resonator electrodes, and wherein a dielectric constant of the third portion of the substrate assembly is lower than one of a dielectric constant of the first portion of the substrate assembly and a dielectric constant of the second portion of the substrate assembly; and a second filter coupled to the antenna port.

14. An antenna duplexer comprising:

an antenna port; and first and second filters, each including a dielectric filter and each being coupled to the antenna port, each of the dielectric filters comprising:

a dielectric substrate assembly including a first dielectric substrate, a second dielectric substrate on the first dielectric substrate, and a third dielectric substrate on the second dielectric substrate;

a plurality of resonator electrodes made of metallic foil provided in the dielectric substrate assembly, each of the resonator electrodes having a first surface on the second dielectric substrate, a second surface opposite to the first surface, and a side surface connected to the first surface and the second surface, the resonator electrodes adapted to be electromagnetically coupled with each other;

an inter-stage coupling capacitor electrode provided on the first dielectric substrate, the inter-stage coupling capacitor electrode for coupling the resonator electrodes; and an input/output coupling capacitor electrode provided on the third dielectric substrate, the input/output coupling electrode for inputting and outputting a signal to the resonator electrodes, wherein the dielectric substrate assembly has a first portion located on the first surface of each of the resonator electrodes, a second portion located on the second surface of each of the resonator electrodes, and a third portion located on the side surface of each of the resonator electrodes, and wherein a dielectric constant of the third portion of the substrate assembly is lower than one of a dielectric constant of the first portion of the substrate assembly and a dielectric constant of the second portion of the substrate assembly.

15. A dielectric filter comprising:

first, second, and third dielectric substrates laminated together;

a plurality of resonator electrodes on the first dielectric substrate, the resonator electrodes adapted to be electromagnetically coupled with each other;

an inter-stage coupling capacitor electrode on the second dielectric substrate for coupling the resonator electrodes; and an input/output coupling capacitor electrode on the third dielectric substrate for inputting and outputting a signal to the resonator electrodes, wherein the first dielectric substrate includes:

a first dielectric portion located on a center of each of the resonator electrodes and a second dielectric portion located on both sides of each of the resonator electrodes, the second dielectric portion having a lower relative dielectric constant than the first dielectric portion.

16. A dielectric filter according to claim 15, wherein each of the resonator electrodes has a short-circuit end at one end and an open end at another end.

17. A dielectric filter according to claim 16, wherein each of the resonator electrodes has a wide portion at the open end thereof.

18. A dielectric filter according to claim 15, wherein each of the resonator electrodes has open ends at both ends thereof.

19. A dielectric filter according to claim 18, wherein each of the resonator electrodes has a wide portion provided at at least one of the open ends thereof.

20. A dielectric filter according to claim 15, wherein at least one of the resonator electrodes, the inter-stage coupling capacitor electrode, and the input/output coupling capacitor electrode is formed with a printed pattern of conductive paste containing at least one of gold, silver, and copper.

21. A dielectric filter according to claim 15, wherein at least one of the resonator electrodes, the inter-stage coupling capacitor electrode, and the input/output coupling capacitor electrode is formed with a metallic foil containing at least one of gold, silver, and copper.

22. A dielectric filter according to claim 15, wherein the second dielectric substrate includes:

a first dielectric portion located on the center of each of the resonator electrodes; and a second dielectric portion located on both the sides of each of the resonator electrodes, the second dielectric portion of the second dielectric substrate having a lower relative dielectric constant than the first dielectric portion of the second dielectric substrate.

23. A dielectric filter according to claim 22, wherein the inter-stage coupling capacitor electrode is located at the second dielectric portion of the second dielectric substrate, and wherein the third dielectric substrate includes:

a first dielectric portion; and a second dielectric portion located on the input/output coupling capacitor electrode, the second dielectric portion of the third dielectric substrate having a lower relative dielectric constant than the first dielectric portion of the third dielectric substrate.

24. A dielectric filter according to claim 23, wherein the first dielectric portion of the first dielectric substrate, the first dielectric portion of the second dielectric substrate, and the first dielectric portion of the third dielectric substrate are made of ceramic material of one of Bi—Ca—Nb—O base, Ba—Ti—O base, and Zr(Mg, Zn, Nb)Ti—Mn—O base, and wherein the second dielectric portion of the first dielectric substrate, the second dielectric portion of the second dielectric substrate, and the second dielectric portion of the third dielectric substrate are made of ceramic material of one of forsterite and alumina borosilicate glass.

25. A dielectric filter according to claim 15, wherein the first dielectric portion of the first dielectric substrate is made of ceramic material of one of Bi—Ca—Nb—O base, Ba—Ti—O base, and Zr(Mg, Zn, Nb)Ti—Mn—O base, and wherein the second dielectric portion of the first dielectric substrate is made of ceramic material of one of forsterite and alumina borosilicate glass.

26. A dielectric filter according to claim 22, wherein the first dielectric portion of the first dielectric substrate and the first dielectric portion of the second dielectric substrate are made of ceramic material of one of Bi—Ca—Nb—O base, Ba—Ti—O base, and Zr(Mg, Zn, Nb)Ti—Mn—O base, and wherein the second dielectric portion of the first dielectric substrate and the second dielectric portion of the second dielectric substrate are made of ceramic material of one of forsterite and alumina borosilicate glass.

27. A dielectric filter according to claim 22, wherein the first dielectric portion of the second dielectric substrate is made of ceramic material of one of Bi—Ca—Nb—O base, Ba—Ti—O base, and Zr(Mg, Zn, Nb)Ti—Mn—O base, and wherein the second dielectric portion of the second dielectric substrate is made of ceramic material of one of forsterite and alumina borosilicate glass.

28. An antenna duplexer comprising:

an antenna port;

a first filter including a dielectric filter, the dielectric filter comprising:

first, second, and third dielectric substrates laminated together;

a plurality of resonator electrodes on the first dielectric substrate, the resonator electrodes adapted to be electromagnetically coupled with each other;

an inter-stage coupling capacitor electrode on the second dielectric substrate for coupling the resonator electrodes; and an input/output coupling capacitor electrode on the third dielectric substrate for inputting and outputting a signal to the resonator electrodes, wherein the first and second dielectric substrates include a first dielectric portion located on a center of each of the resonator electrodes, and a second dielectric portion located on both sides of each of the resonator electrodes, the second dielectric portion having a lower relative dielectric constant than the first dielectric portion and a second filter coupled to the antenna port.

29. An antenna duplexer comprising:

an antenna port; and first and second filters each including a dielectric filter and being coupled to the antenna port, each of the dielectric filters comprising:

first, second, and third dielectric substrates laminated together;

a plurality of resonator electrodes on the first dielectric substrate, the resonator electrodes adapted to be electromagnetically coupled with each other;

an inter-stage coupling capacitor electrode on the second dielectric substrate for coupling the resonator electrodes; and an input/output coupling capacitor electrode on the third dielectric substrate for inputting and outputting a signal to the resonator electrodes, wherein the first and second dielectric substrates include:

a first dielectric portion located on a center of each of the resonator electrodes; and a second dielectric portion located on both sides of each of the resonator electrodes, the second dielectric portion having a lower relative dielectric constant than the first dielectric portion.

30. A communication apparatus including an antenna duplexer comprising:

an antenna port;

a first filter including a dielectric filter, the dielectric filter comprising:

first, second, and third dielectric substrates laminated together;

a plurality of resonator electrodes on the first dielectric substrate, the resonator electrodes adapted to be electromagnetically coupled with each other;

an inter-stage coupling capacitor electrode on the second dielectric substrate for coupling the resonator electrodes; and an input/output coupling capacitor electrode on the third dielectric substrate for inputting and outputting a signal to the resonator electrodes, wherein the first and second dielectric substrates include a first dielectric portion located on a center of each of the resonator electrodes, and a second dielectric portion located on both sides of each of the resonator electrodes, the second dielectric portion having a lower relative dielectric constant than the first dielectric portion; and a second filter coupled to the antenna port.

31. A communication apparatus including a dielectric filter comprising:

first, second, and third dielectric substrates laminated together;

a plurality of resonator electrodes on the first dielectric substrate, the resonator electrodes adapted to be electromagnetically coupled with each other;

an inter-stage coupling capacitor electrode on the second dielectric substrate for coupling the resonator electrodes; and an input/output coupling capacitor electrode on the third dielectric substrate for inputting and outputting a signal to the resonator electrodes, wherein the first and second dielectric substrates include:

a first dielectric portion located on a center of each of the resonator electrodes; and a second dielectric portion located on both sides of each of the resonator electrodes, the second dielectric portion having a lower relative dielectric, constant than the first dielectric portion.

32. A dielectric filter comprising:

first, second, and third dielectric substrates laminated together;

a plurality of resonator electrodes on the first dielectric substrate, the resonator electrodes adapted to be electromagnetically coupled with each other;

an inter-stage coupling capacitor electrode on the second dielectric substrate for coupling the resonator electrodes; and an input/output coupling capacitor electrode on the third dielectric substrate for inputting and outputting a signal to the resonator electrodes, wherein the second dielectric substrates includes:

a first dielectric portion located on a center of each of the resonator electrodes; and a second dielectric portion located on both sides of each of the resonator electrodes, the second dielectric portion having a lower relative dielectric constant than the first dielectric portion.

33. A dielectric filter according to claim 32, wherein each of the resonator electrodes has a short-circuit end at one end and an open end at another end.

34. A dielectric filter according to claim 33, wherein each of the resonator electrodes has a wide portion at the open end thereof.

35. A dielectric filter according to claim 32, wherein each of the resonator electrodes has open ends at both ends thereof.

36. A dielectric filter according to claim 35, wherein each of the resonator electrodes has a wide portion at at least one of the open ends thereof.

37. A dielectric filter according to claim 32, wherein at least one of the resonator electrodes, the inter-stage coupling capacitor electrode, and the input/output coupling capacitor electrode is formed with a printed pattern of conductive paste containing at least one of gold, silver, and copper.

38. A dielectric filter according to claim 32, wherein at least one of the resonator electrodes, the inter-stage coupling capacitor electrode, and the input/output coupling capacitor electrode is formed with a metallic foil containing at least one of gold, silver, and copper.

39. A dielectric filter according to claim 32, wherein the inter-stage coupling capacitor electrode is located at the second dielectric portion of the second dielectric substrate, and wherein the third dielectric substrate includes:

a first dielectric portion; and a second dielectric portion located on the input/output coupling capacitor electrode, the second dielectric portion of the third dielectric substrate having a lower relative dielectric constant than the first dielectric portion of the third dielectric substrate.

40. A dielectric filter according to claim 39, wherein the first dielectric portion of the second dielectric substrate and the first dielectric portion of the third dielectric substrate are made of ceramic material of one of Bi—Ca—Nb—O base, Ba—Ti—O base, and Zr(Mg, Zn, Nb)Ti—Mn—O base, and wherein the second dielectric portion of the second dielectric substrate and the second dielectric portion of the third dielectric substrate are made of ceramic material of one of forsterite and alumina borosilicate glass.

41. An antenna duplexer comprising:

an antenna port;

a first filter including a dielectric filter, the dielectric filter comprising:

first, second, and third dielectric substrates laminated together;

a plurality of resonator electrodes on the first dielectric substrate, the resonator electrodes adapted to be electromagnetically coupled with each other;

an inter-stage coupling capacitor electrode on the second dielectric substrate for coupling the resonator electrodes;

an input/output coupling capacitor electrode on the third dielectric substrate for inputting and outputting a signal to the resonator electrodes, wherein the second dielectric substrates includes a first dielectric portion located on a center of each of the resonator electrodes, and a second dielectric portion located on both sides of each of the resonator electrodes, the second dielectric portion having a lower relative dielectric constant than the first dielectric portion; and a second filter coupled to the antenna port.

42. An antenna duplexer comprising:

an antenna port;

first and second filters each including a dielectric filter and being coupled to the antenna port, each of the dielectric filters comprising:

first, second, and third dielectric substrates laminated together;

a plurality of resonator electrodes on the first dielectric substrate, the resonator electrodes adapted to be electromagnetically coupled with each other;

an inter-stage coupling capacitor electrode on the second dielectric substrate for coupling the resonator electrodes; and an input/output coupling capacitor electrode on the third dielectric substrate for inputting and outputting a signal to the resonator electrodes, wherein the second dielectric substrates includes:

a first dielectric portion located on a center of each of the resonator electrodes; and a second dielectric portion located on both sides of each of the resonator electrodes, the second dielectric portion having a lower relative dielectric constant than the first dielectric portion.

43. A communication apparatus including an antenna duplexer comprising:

an antenna port;

a first filter including a dielectric filter, the dielectric filter comprising:

first, second, and third dielectric substrates laminated together;

a plurality of resonator electrodes on the first dielectric substrate, the resonator electrodes adapted to be electromagnetically coupled with each other;

an inter-stage coupling capacitor electrode on the second dielectric substrate for coupling the resonator electrodes; and an input/output coupling capacitor electrode on the third dielectric substrate for inputting and outputting a signal to the resonator electrodes, wherein the second dielectric substrate includes a first dielectric portion located on a center of each of the resonator electrodes, and a second dielectric portion located on both sides of each of the resonator electrodes, the second dielectric portion having a lower relative dielectric constant than the first dielectric portion; and a second filter coupled to the antenna port.

44. A communication apparatus including a dielectric filter comprising:

first, second, and third dielectric substrates laminated together;

a plurality of resonator electrodes on the first dielectric substrate, the resonator electrodes adapted to be electromagnetically coupled with each other;

an inter-stage coupling capacitor electrode on the second dielectric substrate for coupling the resonator electrodes; and an input/output coupling capacitor electrode on the third dielectric substrate for inputting and outputting a signal to the resonator electrodes, wherein the second dielectric substrate includes:

a first dielectric portion located on a center of each of the resonator electrodes; and a second dielectric portion located on both sides of each of the resonator electrodes, the second dielectric portion having a lower relative dielectric constant than the first dielectric portion.

* * * * *

UNITED STATES PATENT AND TRADEMARK OFFICE
CERTIFICATE OF CORRECTION

PATENT NO. : 6,965,284 B2
DATED : November 15, 2005
INVENTOR(S) : Tomoya Maekawa et al.

It is certified that error appears in the above-identified patent and that said Letters Patent is hereby corrected as shown below:

Title page,
Item [54], Title, change to read as follows:
-- DIELECTRIC FILTER, ANTENNA DUPLEXER AND COMMUNICATION APPARATUS USING THE FILTER --.
Item [57], ABSTRACT,
Line 5, insert -- and -- after “structure,”.

Drawings,
Delete Sheets 5, 10 and 14 and replace with the attached sheets.

Signed and Sealed this

Twenty-eighth Day of March, 2006

JON W. DUDAS
*Director of the United States Patent and Trademark Office*